United States Patent
Yuzurihara et al.

(10) Patent No.: US 9,699,878 B2
(45) Date of Patent: Jul. 4, 2017

(54) UNIGNITED PLASMA STATE DISCRIMINATION DEVICE AND UNIGNITED PLASMA STATE DISCRIMINATION METHOD

(71) Applicant: KYOSAN ELECTRIC MFG. CO., LTD., Yokohama-shi, Kanagawa (JP)

(72) Inventors: Itsuo Yuzurihara, Yokohama (JP); Satoshi Aikawa, Yokohama (JP); Ryosuke Ohma, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 15/037,609

(22) PCT Filed: Dec. 26, 2013

(86) PCT No.: PCT/JP2013/084820
§ 371 (c)(1),
(2) Date: May 18, 2016

(87) PCT Pub. No.: WO2015/079595
PCT Pub. Date: Jun. 4, 2015

(65) Prior Publication Data
US 2016/0295675 A1    Oct. 6, 2016

(30) Foreign Application Priority Data
Nov. 29, 2013  (JP) .................. 2013-247660

(51) Int. Cl.
*H05H 1/00* (2006.01)
*H05H 1/46* (2006.01)
*H01J 37/32* (2006.01)

(52) U.S. Cl.
CPC ..... *H05H 1/0012* (2013.01); *H01J 37/32082* (2013.01); *H01J 37/3299* (2013.01);
(Continued)

(58) Field of Classification Search
CPC .................................. H05H 1/46; H05H 1/00
See application file for complete search history.

(56) References Cited

U.S. PATENT DOCUMENTS 8,169,162 B2    5/2012  Yuzurihara et al.
2004/0244693 A1  12/2004  Ishii et al.
(Continued)

FOREIGN PATENT DOCUMENTS

CN    102474972 A    5/2012
EP      1971188 A1    9/2008
(Continued)

OTHER PUBLICATIONS

Office Action and Search Report dated May 5, 2016, issued in counterpart Taiwanese Patent Application No. 103105207, with English translation. (3 pages).
(Continued)

*Primary Examiner* — Marcus Taningco
(74) *Attorney, Agent, or Firm* — Westerman, Hattori, Daniels & Adrian, LLP

(57) ABSTRACT

In detecting the unignited state of plasma based on a reflected wave, false detection during a normal plasma ignition time is prevented so as to detect the unignited state during plasma abnormality. When a pulse output is supplied to a plasma load by pulse driving from an RF power source, the unignited state of plasma abnormality is detected on the basis of the continuous state of the reflected wave, whereby a total reflected wave generated in the unignited state during plasma abnormality is detected in distinction from the reflected wave generated in the normal ignited state. With this configuration, in detecting the unignited state by comparing a peak value of the reflected wave with a threshold, it is possible to prevent that a reflected wave generated in the normal ignited state is erroneously detected as the total (Continued)

UNIGNITED STATE DETECTION CIRCUIT (ANALOGUE)

reflected wave that is generated in the abnormal unignited state.

8 Claims, 20 Drawing Sheets

(52) U.S. Cl.
CPC .. *H01J 37/32174* (2013.01); *H01J 37/32935* (2013.01); *H05H 1/46* (2013.01); *H05H 2001/4645* (2013.01); *H05H 2001/4682* (2013.01)

(56) References Cited

U.S. PATENT DOCUMENTS

| 2007/0121267 | A1 | 5/2007 | Kotani et al. |
| 2011/0032047 | A1 | 2/2011 | Yuzurihara et al. |
| 2012/0280618 | A1* | 11/2012 | Utano .............. H01J 37/32009 315/111.41 |

FOREIGN PATENT DOCUMENTS

| EP | 2259662 | A1 | 12/2010 |
| JP | 9-260096 | A | 10/1997 |
| JP | H09-260096 | A | 10/1997 |
| JP | 2004-8893 | A | 1/2004 |
| JP | 2004-39844 | A | 2/2004 |
| JP | 2011-052279 | A | 3/2011 |
| JP | 2011-52279 | A | 3/2011 |
| TW | 2009-42089 | A | 10/2009 |
| WO | 2007/074843 | A1 | 7/2007 |
| WO | 2013/031482 | A1 | 3/2013 |

OTHER PUBLICATIONS

Office Action dated Aug. 22, 2016, issued in counterpart Chinese Patent Application No. 201380080864.2, with English translation. (14 pages).

Notice of Reasons for Refusal dated Sep. 9, 2016, issued in counterpart Korean Patent Application No. 10-2016-7012131, with English translation. (8 pages).

International Search Report dated Feb. 18, 2014, issued in counterpart International Application No. PCT/JP2013/084820 (1 page).

Decision of Grant a Patent dated Nov. 30, 2015, issued in counterpart Japanese Patent Application No. 2013-247660, w/English translation (6 pages).

* cited by examiner

| IGNITED STATE (LOW-FREQUENCY PULSE MODE) | IGNITED STATE (HIGH-FREQUENCY PULSE MODE) |
|---|---|
| FIG. 3A FORWARD VOLTAGE 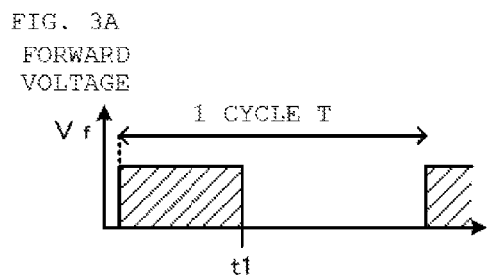 | FIG. 3E FORWARD VOLTAGE 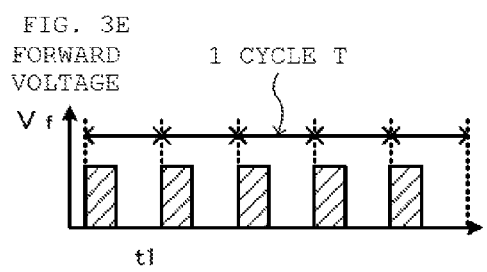 |
| FIG. 3B REFLECTED WAVE VOLTAGE 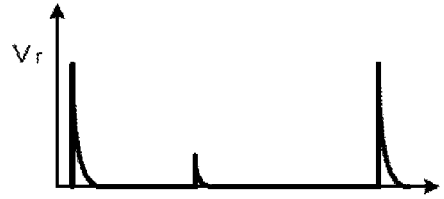 | FIG. 3F REFLECTED WAVE VOLTAGE 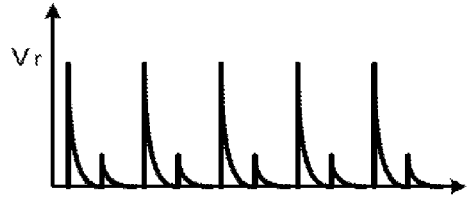 |
| FIG. 3C EQUIVALENT AMOUNT OF HEAT STORAGE 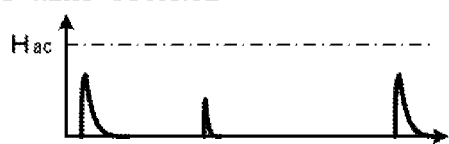 | FIG. 3G EQUIVALENT AMOUNT OF HEAT STORAGE 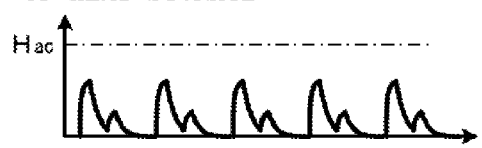 |
| FIG. 3D 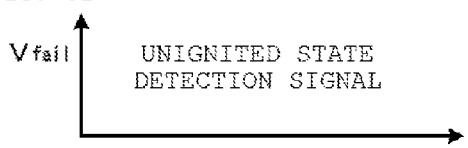 UNIGNITED STATE DETECTION SIGNAL | FIG. 3H  UNIGNITED STATE DETECTION SIGNAL |

UNIGNITED STATE
(LOW-FREQUENCY
PULSE MODE)

UNIGNITED STATE
(HIGH-FREQUENCY
PULSE MODE)

FORWARD VOLTAGE

FORWARD VOLTAGE

REFLECTED WAVE VOLTAGE

REFLECTED WAVE VOLTAGE

EQUIVALENT AMOUNT OF HEAT STORAGE

EQUIVALENT AMOUNT OF HEAT STORAGE

UNIGNITED STATE DETECTION SIGNAL

UNIGNITED STATE DETECTION SIGNAL

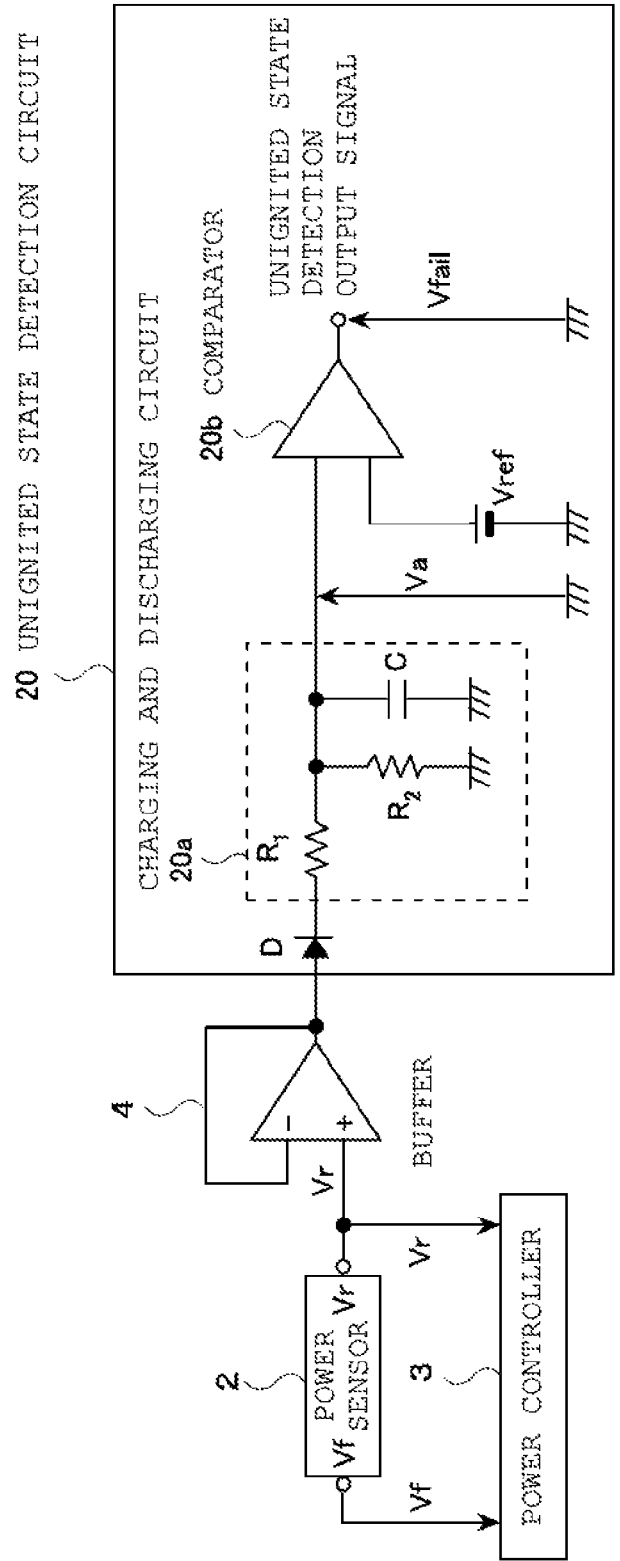
FIG. 7 UNIGNITED STATE DETECTION CIRCUIT (ANALOGUE)
Vf: FORWARD WAVE DETECTION VOLTAGE
Vr: REFLECTED WAVE DETECTION VOLTAGE OPERATION OF UNIGNITED STATE
DETECTION CIRCUIT IN NORMAL TIME
(LOW-FREQUENCY PULSE MODE)

OPERATION OF UNIGNITED STATE
DETECTION CIRCUIT IN NORMAL TIME
(HIGH-FREQUENCY PULSE MODE)

OPERATION OF UNIGNITED STATE
DETECTION CIRCUIT IN ABNORMAL TIME
(ALLOWABLE ON-TIME)

OPERATION OF UNIGNITED STATE
DETECTION CIRCUIT IN ABNORMAL TIME
(HIGH-FREQUENCY PULSE MODE)

UNIGNITED STATE DETECTION CIRCUIT

FIG. 14 CIRCUIT INPUT SIGNAL

CIRCUIT STATE DURING RFon TIME

CIRCUIT STATE DURING RFoff TIME

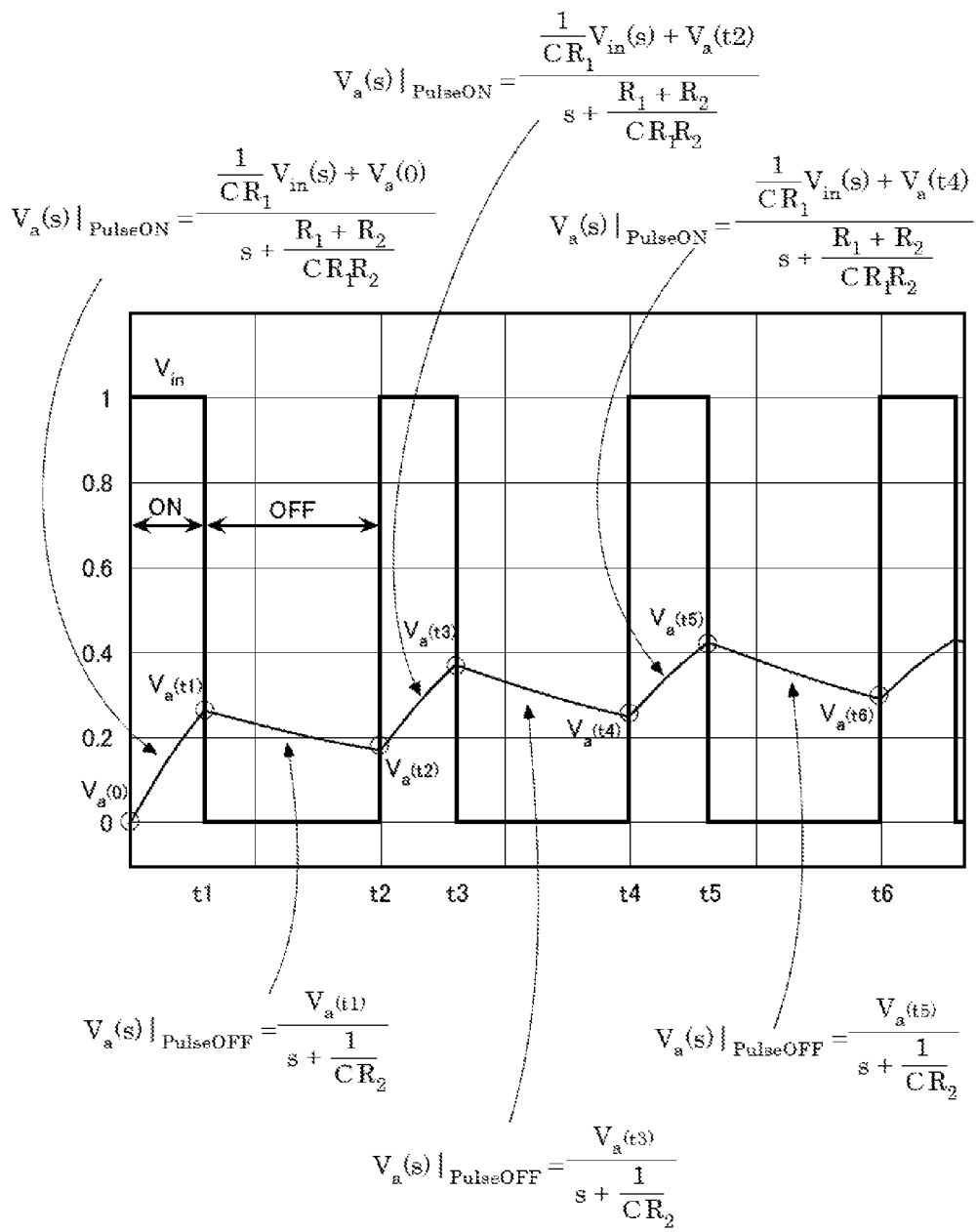
FIG. 17 VARIATION OF $V_a$ POTENTIAL

UNIGNITED PLASMA STATE DISCRIMINATION DEVICE AND UNIGNITED PLASMA STATE DISCRIMINATION METHOD

TECHNICAL FIELD

The present invention relates to detection of an unignited state of plasma, and more particularly, it relates to a device for detecting the unignited state of plasma and to a detection method thereof, in generating plasma by supplying RF power from a radio frequency power source (RF power source).

BACKGROUND ART

It is known that plasma generated by radio frequency (RF) is used in a plasma processor such as semiconductor producing equipment and electronic device producing equipment, and in a plasma generator such as a $CO_2$ laser beam machine. It is also known that plasma is generated by CW (continuous wave) driving or pulse driving a radio frequency power source (RF power source).

FIG. 20 schematically illustrates driving of a plasma load, using the radio frequency power source (RF power source). In FIG. 20, a pulse output delivered from the radio frequency power source (RF power source) 100 is supplied to the plasma load 102, such as a plasma processor and a $CO_2$ laser beam machine.

The pulse output from the RF power source according to the pulse driving corresponds to a radio frequency (RF) output that repeats on and off at high frequencies. In the pulse driving of the radio frequency power source (RF power source), forward wave voltage of the pulse output is intermittently supplied to the plasma load, causing repetition of plasma on and off in the plasma load.

When the RF output is switched between the on-state and the off-state, a reflected wave is generated, even though the pulse driving state is normal. During a period from the point when the RF output is switched from the off-state to the on-state, to the point when the plasma is ignited, reflection coefficient Γ becomes approximately one (Γ≈1), and this may cause a mismatching state, leading to a total reflection state for a while. At this moment, a reflected wave is generated from the plasma load toward the RF power source. Natural oscillation of a matching box, an action of plasma ignition, or the like, may be a factor of the reflected wave occurrence.

In the plasma igniting operation, the reflected wave according to the pulse driving as described above is generated in any of the following states where; plasma is in the state normally ignited, and plasma is in the unignited state without being ignited normally.

If the reflected wave thus generated enters the RF power source, high voltage of the reflected wave may cause damage of an RF power amplifier element provided in the RF power source.

In order to prevent such element damage due to the reflected wave, it is known that generation of the reflected wave that returns from the load to the RF power source is detected, and an output from the RF power source is made to droop or suspended on the basis of the detection of the reflected wave.

As a technique for detecting the unignited state of plasma, being a factor of generating the reflected wave, it is known that a power monitor monitors the reflected wave returning from the load to the RF power source, and when a peak value of the reflected wave is lower than a threshold, it is determined that the plasma is ignited, whereas when the peak value is higher than the threshold, it is determined that plasma is not ignited (see Patent Document 1).

In addition, in order to protect a high-frequency oscillator against the reflected wave, it is known that when the reflected wave exceeds a defined value, a radio frequency output is made to droop or suspended (see Patent Document 2), and forward wave power is reduced (made to droop) on the basis of a deviation between the reflected wave power and preset reflected wave power (see Patent Document 3).

PRIOR ART DOCUMENT

Patent Document

Patent Document 1
Japanese Unexamined Patent Application Publication No. 9-260096 (paragraphs [0043] and [0044])
Patent Document 2
Japanese Unexamined Patent Application Publication No. 2004-39844 (paragraphs [0010] and [0044])
Patent Document 3
Japanese Unexamined Patent Application Publication No. 2004-8893 (paragraphs [0011] and [0019])

DISCLOSURE OF THE INVENTION

Problems to be Solved by the Invention a) In supplying RF power for igniting plasma by pulse driving, a protecting operation is required by drooping or suspension of the output against a reflected wave due to mismatching in the state where the plasma is not ignited, so as to prevent damage of an RF power amplifier element; on the other hand, when plasma is normally ignited, it is required to continue outputting radio frequency power without drooping or suspension of the output.

Such ignited state and unignited state of plasma as described above are required to be addressed differently. In a conventional way of detecting the unignited state of plasma on the basis of a peak value of a reflected wave, a reflected wave repeatedly generated in the normal ignited state and a reflected wave generated in the unignited state, are detected without distinction therebetween. Therefore, there is a possibility that a reflected wave generated in the plasma ignited state may be detected erroneously as a total reflected wave of the unignited plasma state.

When a protective operation, such as output drooping or output suspension, is performed according to false detection in the plasma ignited state, supplying of radio frequency power is restricted even though the plasma is ignited normally. Therefore, this may lead to an undesirable state, such as temporarily destabilizing the normally ignited plasma, or extinguishing the plasma. Those unstable operations of plasma may cause a product quality deterioration in a semiconductor manufacturing, for instance.

b) When the unignited state of plasma is detected according to the conventional way on the basis of the peak value of the reflected wave, a transient projected fluctuation of the reflected wave may be detected, but it may fail in detecting a condition of the output over a predetermined period of time. Therefore, it is not possible to detect the state where a total reflected wave continues over a predetermined period time, like the unignited plasma state.

Therefore, there is a problem that the reflected wave is applied to the RF power amplifier element, with application of heat thereto, continuously for a predetermined period of time, and the RF power amplifier element can not be protected against thermal failure due to the heat storage caused by the heating.

Thus, the detection of the unignited state of plasma on the basis of the peak value of the reflected wave involves the following problems; a) false detection in the ignited state of plasma, and b) failure in element protection against damage in the unignited state of plasma, caused by heat storage in the RF amplifier element.

The present invention aims at solving the aforementioned conventional problems, and an object of the present invention is to prevent false detection at the time of normal plasma ignition so as to detect the unignited state when plasma is abnormal, in detecting the unignited state of plasma according to the reflected wave.

Another object of the present invention is to detect a total reflected wave that continues over a predetermined period of time in the unignited plasma state, in detecting the unignited state of plasma.

Still another object of the present invention is to detect the total reflected wave that continues over a predetermined period of time in the unignited plasma state, thereby protecting an element against a damage due to heat storage in the RF amplifier element in the unignited state of plasma.

Means for Solving the Problems

In view of the problems as described above, the present invention is directed to detecting voltage of a reflected wave that returns from a plasma load to an RF power source, when a pulse output is supplied to the plasma load from the RF power source by pulse driving, and detecting the unignited state when the plasma is abnormal, on the basis of the continuous state of the reflected wave being obtained from the reflected wave voltage thus detected.

According to the present invention, the unignited state of plasma abnormality is detected on the basis of the continuous state of the reflected wave, whereby a total reflected wave generated in the unignited state of plasma abnormality is detected in distinction from the reflected wave generated in the normal ignited state. With this configuration, it is possible to prevent that a reflected wave generated in the normal ignited state is erroneously detected as the totally reflected wave that is generated in the abnormal unignited state, in detecting the unignited state by comparing a peak value of the reflected wave voltage with a threshold.

According to the present invention, the unignited state of plasma (abnormality) is detected within the duration of time when the radio frequency power source (RF power source) is allowed to receive a total reflected wave, starting from a point when a radio frequency output (RF output) is delivered. Upon detecting the unignited state and receiving an output signal (abnormal signal), the radio frequency power source (RF power source) performs a protective operation such as output drooping or output suspension, thereby protecting the RF power source.

According to the present invention, an instantaneous reflection that occurs repeatedly during the time when plasma is normally ignited is determined as normal, and the unignited state detection signal is not outputted. On the other hand, if a radio frequency output (RF output) is applied while plasma is still in the unignited state, a total reflected wave continuously generated during the time when the radio frequency output is applied, is determined as abnormal, and an unignited state detection signal is outputted.

According to the present invention, instantaneous reflection that occurs repeatedly when plasma is ignited normally, is determined as normal, and thus, it is possible to prevent false detection that plasma is unignited.

According to the present invention, when plasma is unignited, if a radio frequency output (RF output) is applied to the load and a total reflected wave is generated continuously, an equivalent value corresponding to an amount of heat applied to the RF power amplifier element is obtained, thereby detecting the unignited state prior to exceeding a permissible amount of reflected wave of the RF power amplifier element, and outputting an abnormal signal.

By detecting the unignited state at the time of plasma abnormality without influenced by the reflected wave generated in the state normally ignited, following points are simultaneously solved; ensuring stable plasma in the normally ignited state, and preventing a damage of the RF power amplifier element in the event of plasma load abnormality.

According to the present invention, a protective operation can be performed prior to exceeding the permissible amount of reflected wave of the RF power amplifier element in the radio frequency power source (RF power source). Therefore, just a minimum configuration is necessary because it is only required to consider a loss during a normal operation but not a loss when abnormality occurs, in the configuration of the power amplifier element of the radio frequency power source (RF power source).

An aspect of the present invention is directed to a method and another aspect thereof is directed to a device.

[Method of Detecting Unignited State of Plasma]

The aspect of the present invention directed to the method of detecting the unignited state of plasma detects reflected wave voltage that travels from a plasma load to an RF power source, when a pulse output is supplied from the RF power source to the plasma load by pulse driving, and obtains an equivalent amount corresponding to an amount of heat applied to the RF power amplifier element of the RF power source, on the basis of a peak value and a fluctuating state of the reflected wave voltage being detected.

Then, thus obtained equivalent amount is compared with a threshold corresponding to an allowable heat quantity of the RF power amplifier element, and the unignited state of plasma is detected according to a result of the comparison. When the obtained equivalent amount is less than the threshold, it is determined that plasma is not in the state of unignited, whereas when the obtained equivalent amount becomes equal to or exceeds the threshold, it is determined that the plasma is unignited, and the unignited state of plasma is detected.

The method of detecting the unignited state of plasma according to the present invention is provided with following first to third conversion steps for obtaining the equivalent amount corresponding to the amount of heat applied to the RF power amplifier element, and further provided with a comparison step for detecting the unignited state of plasma on the basis of thus obtained equivalent value. Each of the conversion steps and the comparison step may be performed by analogue processing or digital processing, and each step can be implemented by software using a configuration that is provided with a CPU, and a memory that stores programs causing the CPU to perform each of the steps.

The first conversion step is to obtain a first converted value corresponding to an amount of heat that is applied to the RF power amplifier element of the RF power source. The first converted value is obtained on the basis of voltage of the reflected wave being detected and a duration of time of the reflected wave.

The second conversion step is to obtain a second converted value corresponding to an amount of heat dissipation from the RF power amplifier element of the RF power source. The second converted value is obtained in every cycle of pulse driving, on the basis of an elapsed time from when the peak value of the reflected wave voltage $V_r$ becomes zero, or an elapsed time from when application of a pulse output is started.

The third conversion step is to obtain a third converted value corresponding to an amount of stored heat that is stored in the RF power amplifier element of the RF power source. The third converted value is obtained from a difference between the first converted value and the second converted value.

The comparison step is a step of comparing the obtained equivalent value with a threshold, so as to detect the unignited state of plasma, and the third converted value obtained in the third conversion step is compared with the threshold corresponding to the allowable heat quantity of the RF power amplifier element, and when the third converted value reaches or exceeds the threshold, the unignited state of plasma is detected.

For performing the conversion steps in the unignited plasma state detection method of the present invention, there are provided a first mode that uses charging and discharging voltage and a second mode that uses a numerical value operation.

(First Mode of the Conversion Step)

In the first mode of the conversion step, an equivalent value is obtained on the basis of charging and discharging voltage. The first converted value corresponding to an amount of heat applied to the RF power amplifier element of the RF power source is obtained according to charging voltage of the reflected wave. The second converted value corresponding to an amount of heat dissipation from the RF power amplifier element of the RF power source, is obtained according to the voltage being discharged. The third converted value corresponding to an amount of heat storage in the RF power amplifier element of the RF power source is obtained by using the voltage that is obtained by subtracting the discharging voltage from the charging voltage.

In charging and discharging, under a pulse driving condition that a pulse frequency of the pulse driving in a normal operation is a maximum settable value and a duty ratio of $RF_{on}$ interval in one cycle of the pulse driving is maximum settable value, a discharging time constant ($\tau_{disc}$) is selected so that it is longer than a charging time constant ($\tau_c$), and charging and discharging voltage does not reach a voltage level of device protection sensing level.

In the conversion step, charging voltage is obtained as the first converted value by charging a peak value of the reflected wave voltage at the charging time constant ($\tau_c$), and voltage provided by discharging at the discharging time constant ($\tau_{disc}$) from the charging voltage being the first converted value is obtained as the third converted value.

Charging and discharging are repeatedly performed in every cycle of pulse driving, and in one cycle, charging is performed assuming as the charging time, the duration of time when a reflected wave is generated, and discharging is performed assuming as the discharging time, the duration of time when the peak value of the reflected wave voltage is zero after completion of the reflected wave generation. A value resulting from charging and discharging corresponds to an equivalent value, indicating an amount of heat that is applied to the RF power amplifier element by the reflected waves, and on the basis of the equivalent value, the unignited plasma state is detected.

In the state where plasma is ignited normally, a reflected wave is tentatively generated, by a mismatching that occurs due to a rise and a fall of the $RF_{on}$ interval when the pulse output by pulse driving is supplied. On the other hand, in the state where plasma is unignited due to plasma abnormality, a total reflected wave is generated continuously over the $RF_{on}$ interval when the pulse output by pulse driving is supplied.

In charging and discharging by the reflected wave generated in one cycle of pulse driving, if plasma is normally ignited, reflected waves are tentatively generated at a rise and a fall of the $RF_{on}$ interval. Therefore, charging is performed only within a short period when the reflected wave is generated and thereafter, the charging voltage is reduced to zero by discharging. After discharging down to zero voltage, charging and discharging are repeated again starting from zero voltage in the next cycle of pulse driving.

On the other hand, in the unignited plasma state due to plasma abnormality, a total reflected wave is continuously generated as the reflected wave over the $RF_{on}$ interval, and therefore, and charging is performed during the $RF_{on}$ interval and discharging is performed in the subsequent $RF_{off}$ interval, causing a reduction of the charging voltage. By setting the discharging time constant ($\tau_{disc}$) to be longer than the charging time constant ($\tau_c$), in the charging and discharging, the charging and discharging voltage remains without being reduced to zero voltage at the end of the $RF_{off}$ interval.

In charging and discharging in one cycle of pulse driving, if the charging voltage remains without discharged down to zero, charging is restarted from the remaining charging voltage in the next cycle of pulse driving, and such charging and discharging are repeated, leading to a rise of charging and discharging voltage.

As a threshold for detecting the unignited plasma state, a charging and discharging voltage is provided, corresponding to a device protection sensing level for protecting the RF power amplifier element against thermal failure, and this threshold is compared with the charging and discharging voltage. When the charging and discharging voltage reaches or exceeds the threshold, it is determined that the amount of heat applied to the RF power amplifier element reaches or exceeds the device protection sensing level, and it is detected that plasma is unignited.

In the charging and discharging, the discharging time constant ($\tau_{disc}$) is set to be longer than the charging time constant ($\tau_c$), and it is selected so that the charging and discharging voltage does not reach the voltage level of the device protection sensing level, under the condition that the pulse frequency of pulse driving is a maximum settable value and the duty ratio of the $RF_{on}$ interval in one cycle is a maximum settable value.

In the charging and discharging, by setting the discharging time constant ($\tau_{disc}$) to be longer than the charging time constant ($\tau_c$), the voltage at the end of each period remains, and charging and discharging in the next cycle are performed starting from the remaining voltage, thereby enabling obtainment of charging voltage that is accumulated over plural periods. The charging voltage obtained over plural periods corresponds to an equivalent value in association with the amount of heat accumulated in the RF power amplifier element by the pulse output over plural periods, and accordingly, the charging voltage allows monitoring of the heat storage state, not only in one cycle but also over plural periods.

In the pulse driving, under the driving condition that the pulse frequency is a maximum settable value, the period of the pulse output is at the settable shortest time length, and the duty ratio of the $RF_{on}$ interval in one cycle is a maximum settable value, charging and discharging voltage becomes maximum when plasma is normally ignited.

By selecting the discharging time constant ($\tau_{disc}$) in such a manner that the charging and discharging voltage being obtained under this pulse driving condition does not reach the voltage level of the device protection sensing level, it is possible to prevent that plasma is erroneously detected as being unignited, when plasma is ignited normally.

(Second Mode of Conversion Step)

In the second mode of the conversion step, an equivalent value is obtained on the basis of time integration of the reflected wave voltage, and if the time width of interval for outputting pulses is assumed as $RF_{on}$ and the time width of interval not outputting pulses is assumed as $RF_{off}$ in one cycle of plasma driving, the first converted value, the second converted value, and the third converted value are calculated according to the following operation.

The first converted value is calculated according to $(V_r \times k_1 \times \int_0^{RFon} t dt)$ indicating time integration of a product $(V_r \times k_1)$ of the peak value $V_r$ of the reflected wave voltage and a coefficient $k_1$ corresponding to a heat generation coefficient of the RF power amplifier element. The second converted value is calculated according to $(k_2 \times \int_0^{RFoff} t dt)$ indicating the time integration of the coefficient $k_2$ corresponding to the heat dissipation coefficient of the RF power amplifier element. The third converted value is calculated by the operation for subtracting the second converted value from the first converted value $\{(V_r \times k_1 \times \int_0^{RFon} t dt) - (k_2 \times \int_0^{RFoff} t dt)\}$, where zero is the lowermost value. The first converted value, the second converted value, and the third converted value are calculated in every period of plasma driving, and for the conversion in the subsequent period, the third converted value obtained in the previous period is used as an initial value of the first converted value. Time integration can be carried out by digital operation.

[Unignited Plasma State Detection Device]

The unignited plasma state detection device of the present invention is a device configured to detect the unignited state of plasma on the plasma load, in supplying a pulse output to the plasma load by pulse driving from the RF power source, and it is provided with a detection means configured to detect reflected wave voltage traveling from the plasma load to the RF power source, a conversion means configured to obtain an equivalent amount corresponding to an amount of heat applied to the RF power amplifier element of the RF power source, on the basis of a peak value and the fluctuating state of the reflected wave voltage detected by the detection means, and a comparison means configured to compare the equivalent amount obtained by the conversion means with a threshold corresponding to an allowable heat quantity of the RF power amplifier element, and the unignited state of plasma is detected on the basis of a result of the comparison means.

The unignited plasma state detection device of the present invention is provided with the first conversion means, the second conversion means, and the third conversion means, as the conversion means configured to obtain an equivalent amount of the heat that is applied to the RF power amplifier element, and the comparison means configured to detect the unignited plasma on the basis of thus obtained equivalent value. An analog processing circuit or a digital processing circuit may configure each of the conversion means and the comparison means.

The first conversion means is an operation means configured to obtain the first converted value corresponding to the amount of heat that is applied to the RF power amplifier element of the RF power source, and it is obtained on the basis of the reflected wave voltage $V_r$ and the duration of the reflected wave.

The second conversion means is an operation means configured to obtain the second converted value corresponding to the amount of heat dissipation from the RF power amplifier element of the RF power source in the time width when the peak value of the reflected wave voltage is zero, and it is obtained on the basis of the elapsed time since when the peak value of the reflected wave voltage $V_r$ becomes zero or the elapsed time since when a pulse output is started, in every cycle of pulse driving.

The third conversion means is configured to obtain the third converted value corresponding to an amount of heat storage in the RF power amplifier element of the RF power source, and it is obtained from a difference between the first converted value and the second converted value.

The comparison means is configured to compare the third converted value obtained by the third conversion means with a threshold corresponding to the allowable heat quantity of the RF power amplifier element, and the unignited plasma state is detected when the third converted value reaches or exceeds the threshold.

The conversion means of the unignited plasma state detection device of the present invention is provided with a first mode of analog circuit and a second mode of digital circuit.

(First Mode of the Conversion Means)

The first mode of the conversion means is configured by an analog circuit of the charging and discharging circuit, including a charging and discharging circuit that charges reflected wave voltage and discharges the charged voltage, and a comparator configured to input an output from the charging and discharging circuit.

In charging and discharging, under the pulse driving condition that the pulse frequency of the pulse driving at a normal time is set to be a maximum settable value and the duty ratio of the $RF_{on}$ interval in one cycle of the pulse driving is set to be a maximum settable value, the discharging time constant ($\tau_{disc}$) of the charging and discharging circuit has a value that is selected in such a manner that it is longer than the charging time constant ($\tau_c$) and the charging and discharging voltage does not reach a voltage level being the device protection sensing level.

In the pulse driving, under the driving condition that the pulse frequency is a maximum settable value, the period of the pulse output is a settable shortest time length, and the duty ratio of the $RF_{on}$ interval in one cycle is a maximum settable value, charging and discharging voltage becomes maximum when plasma is normally ignited.

Under this pulse driving condition, the discharging time constant ($\tau_{disc}$) is selected in such a manner that the charging and discharging voltage being obtained does not reach the voltage at the device protection sensing level, whereby it is possible to prevent erroneously detecting that plasma is unignited when the plasma ignition state is normal.

In the charging and discharging, by setting the discharging time constant ($\tau_{disc}$) to be longer than the charging time constant ($\tau_c$), the voltage at the end of each period remains, and by making charging and discharging in the next cycle perform starting from the remaining voltage, thereby enabling obtainment of charging voltage that is accumulated over plural periods. The charging voltage obtained over plural periods corresponds to an equivalent value in association with the amount of heat accumulated in the RF power amplifier element by the pulse output over plural periods. With using this equivalent value, it is possible to monitor the heat storage state not only in one cycle but also over plural periods.

A charging part of the charging and discharging circuit configures the first conversion means. The charging part outputs as the first converted value, charging voltage obtained by charging the reflected wave voltage detected by the detection means at the charging time constant ($\tau_c$).

A discharging part of the charging and discharging circuit configures the second conversion means and the third conversion means. The discharging part discharges on the basis of the time width when the peak value of the reflected voltage wave is zero at the discharging time constant ($\tau_{disc}$), from the charged voltage being the first converted value, and outputs the voltage obtained by discharging, as the third converted value.

The comparator configures the comparison means, setting the charging voltage corresponding to the allowable heat quantity of the RF power amplifier element, as the device protection sensing level for protecting against thermal failure, and compares the voltage of the third converted value outputted from the charging and discharging circuit, with the device protection sensing level being a threshold.

In comparing the threshold with the charging and discharging voltage, when the charging and discharging voltage reaches or exceeds the threshold, it is determined that an amount of heat applied to the RF power amplifier element reaches or exceeds the device protection sensing level, it is detected that plasma is unignited.

(Second Mode of the Conversion Means)

The second mode of the conversion means is configured by a digital operation circuit, including an A/D conversion circuit configured to convert reflected wave voltage $V_r$ detected by the detection means into a digital value, and an operation circuit configured to perform a digital operation using the digital value as an input value.

In the operation circuit, it is assumed that in one cycle of plasma driving, the time width of interval for outputting pulses is $RF_{on}$ and the time width of interval not outputting pulses is $RF_{off}$, and the first operation part, the second operation part, and the third operation part are provided, respectively functioning as the first conversion means, the second conversion means, and the third conversion means.

The first operation part calculates the first converted value, according to an operation of $(V_r \times k_1 \times \int_0^{RFon} tdt)$ indicating the time integration of the product $(V_r \times k_1)$ of the peak value $V_r$ of the reflected wave voltage and the coefficient $k_1$ in association with the heat generation coefficient of the RF power amplifier element.

The second operation part calculates the second converted value, according to the operation of $(k_2 \times \int_0^{RFoff} tdt)$ indicating the time integration of the coefficient $k_2$ in association with the heat dissipation coefficient of the RF power amplifier element.

The third operation part performs operation of $\{(V_r \times k_1 \times \int_0^{RFon} tdt) - (k_2 \times \int_0^{RFoff} tdt)\}$ that is established by subtracting the second converted value from the first converted value, and calculates the third converted value assuming a lowermost value of the operational value is zero.

The first converted value, the second converted value, and the third converted value are calculated in every period of the plasma driving, and the operation in the subsequent period for obtaining the first converted value is performed, assuming the third converted value in the previous period as an initial value.

The operation circuit may be configured not only by hardware, but also by software and operations of CPU, using DSP or FPGA.

Advantages of the Invention

As described so far, according to the unignited plasma state detection method and the unignited plasma state detection device according to the present invention, in detecting the unignited state of plasma on the basis of a reflected wave, it is possible to prevent false detection when the plasma is normally ignited, and to detect the unignited state when plasma is abnormal.

According to the unignited plasma state detection method and the unignited plasma state detection device of the present invention, in detecting the unignited state of plasma, it is possible to detect a total reflected wave that continues over a predetermined period of time when the plasma is unignited.

According to the unignited plasma state detection method and the unignited plasma state detection device of the present invention, by detecting the total reflected wave that continues over a predetermined period when plasma is unignited, it is possible to protect the RF amplifying element against an element damage caused by heat storage in the unignited plasma state.

BRIEF DESCRIPTION OF THE DRAWINGS

FIG. 3 illustrates signal diagrams showing the ignited state according to the present invention;

FIG. 7 illustrates an analogue circuit configuration for detecting the unignited state on the basis of charging and discharging voltage of the reflected wave voltage according to the present invention;

FIG. 17 illustrates an example of waveform according to numerical values;

BEST MODE FOR CARRYING OUT THE INVENTION

Preferred embodiments of the present invention will now be described in detail, with reference to the accompanying drawings. An unignited plasma state detection device and a detection method thereof according to the present invention will be described as the following; with reference to FIG. 1, a connecting condition between the unignited plasma state detection device and a power sensor will be described, with reference to FIGS. 2 to 4, a schematic configuration of the unignited plasma state detection will be described, with reference to a flowchart of FIG. 5, steps of the unignited plasma state detection will be described, with reference to FIGS. 6 to 17, a mode for detecting the unignited plasma state by accumulating the reflected wave voltage according to an analogue circuit configuration will be described, and with reference to FIGS. 18 and 19, a mode for detecting the unignited plasma state by accumulating the reflected wave voltage according to a digital circuit configuration will be described. FIGS. 6 to 17 illustrate a configuration example where accumulation of the reflected wave voltage is performed by charging and discharging the reflected wave voltage.

Radio frequency outputs (RF outputs) are supplied from the radio frequency power source (RF power source) by pulse driving, to a plasma load of a plasma processor such as semiconductor producing equipment and electronic device manufacturing equipment, or to a plasma load of a plasma generator such as a $CO_2$ laser beam machine. This pulse driving performs on/off control on the pulse output at a predetermined frequency according to a control signal with a predetermined duty ratio at predetermined intervals, thereby supplying power to the load so as to generate and maintain plasma. The pulse output is supplied to the load while the control signal is on, and supplying of the pulse output is stopped while the control signal is off. Then, according to the duty ratio between on-time and off-time of the control signal (time ratio), the power supplied to the load is controlled. The power controller controls the pulse driving. A frequency of the pulse output of the pulse driving can be provided in accordance with the frequency of the radio frequency output (RF output) that is supplied to the plasma load.

Figure 1:
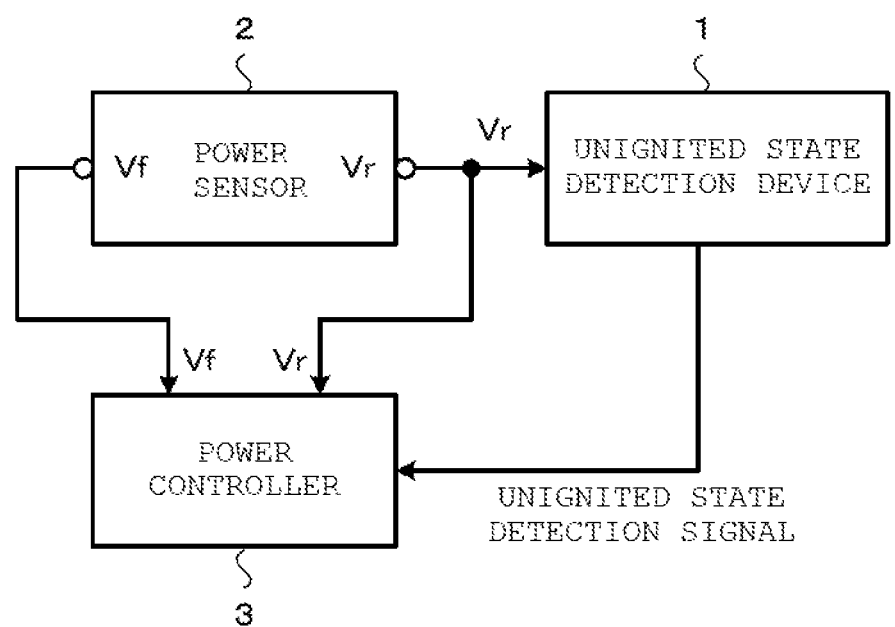
FIG. 1 illustrates a schematic configuration for performing power control on the basis of detection of unignited plasma state of a plasma load.

FIG. 1 illustrates a schematic configuration for performing power control, on the basis of detection whether or not the plasma load is in the unignited plasma state, in the pulse driving of the plasma load by a radio frequency power source (RF power source). FIG. 1 illustrates only a partial configuration for controlling power directed to the plasma load, on the basis of detection of the unignited plasma state.

In FIG. 1, the power sensor 2 is connected between the radio frequency power source (RF power source) and the plasma load, and detects voltage of forward wave power (forward wave voltage $V_f$) directed to the plasma load from the radio frequency power source (RF power source), and voltage of reflected wave power (reflected wave voltage $V_r$) returning from the plasma load to the radio frequency power source (RF power source). The unignited state detection device 1 detects the unignited state of plasma, on the basis of the reflected wave voltage $V_r$ detected by the power sensor 2, and outputs an unignited state detection signal $V_{fail}$ when it is detected that the plasma is unignited.

The power controller 3 controls the pulse driving of the radio frequency power source (RF power source), according to the forward wave voltage $V_f$ and the reflected wave voltage $V_r$, both being inputted from the power sensor 2. By way of example, when the plasma is in the normal ignited state, the power controller controls a duty ratio of a control signal, so that the forward wave voltage $V_f$ becomes a predetermined value on the basis of the forward wave voltage $V_f$ detected by the power sensor 2. On the other hand, when the plasma is in an abnormal state and it is not ignited yet, the power controller 3 performs drooping or suspension control of the radio frequency output.

The unignited state detection device 1 detects the unignited state of plasma, as an abnormal state of plasma. The power controller 3 performs drooping or suspension control of the radio frequency output, on the basis of the unignited state detection signal $V_{fail}$ that is outputted when the unignited state detection device 1 detects the unignited state of plasma.

[Schematic Configuration for Detecting Unignited State According to the Present Invention]

As for the detection of the unignited state of the present invention, a schematic configuration thereof will be described with reference to FIGS. 2 to 4, and a schematic process flow will be described with reference to a flowchart of FIG. 5.

For detecting the unignited plasma state according to the present invention, the unignited state of the plasma is detected on the basis of the state where a reflected wave is generated from the reflected wave voltage $V_r$ that travels from the plasma load to the RF power source.

Figure 2:
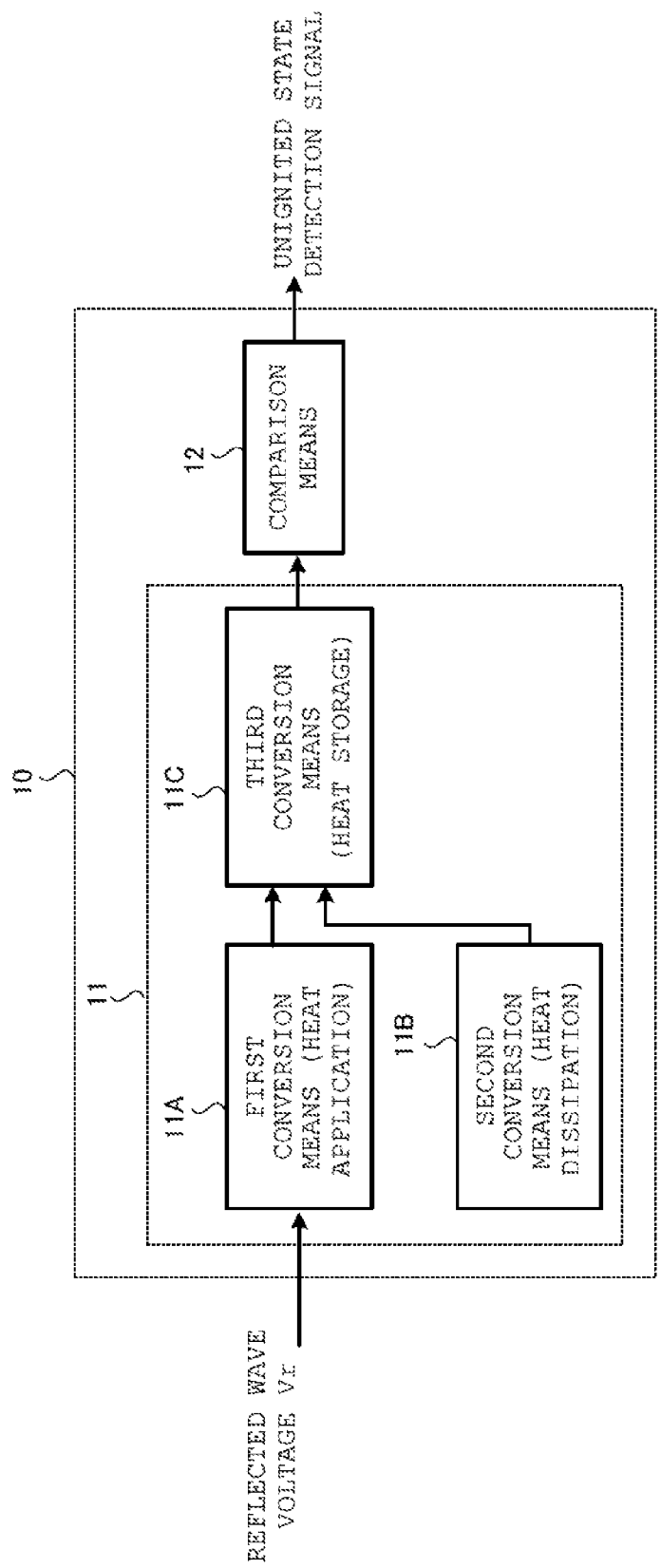
FIG. 2 illustrates a schematic configuration for detecting the unignited state according to the present invention.

FIG. 2 illustrates a schematic configuration of the detection of the unignited state according to the present invention. The unignited state detection device 10 is provided with a conversion means 11 configured to obtain an equivalent amount corresponding to the heat applied to the RF power amplifier element of the RF power source, on the basis of a peak value and a fluctuation state of the reflected wave voltage $V_r$, and a comparison means 12 configured to compare the equivalent amount obtained by the conversion means 11 with a threshold corresponding to an allowable heat quantity of the RF power amplifier element.

The conversion means 11 is provided with a first conversion means 11A, a second conversion means 11B, and a third conversion means 11C.

Figure 5:
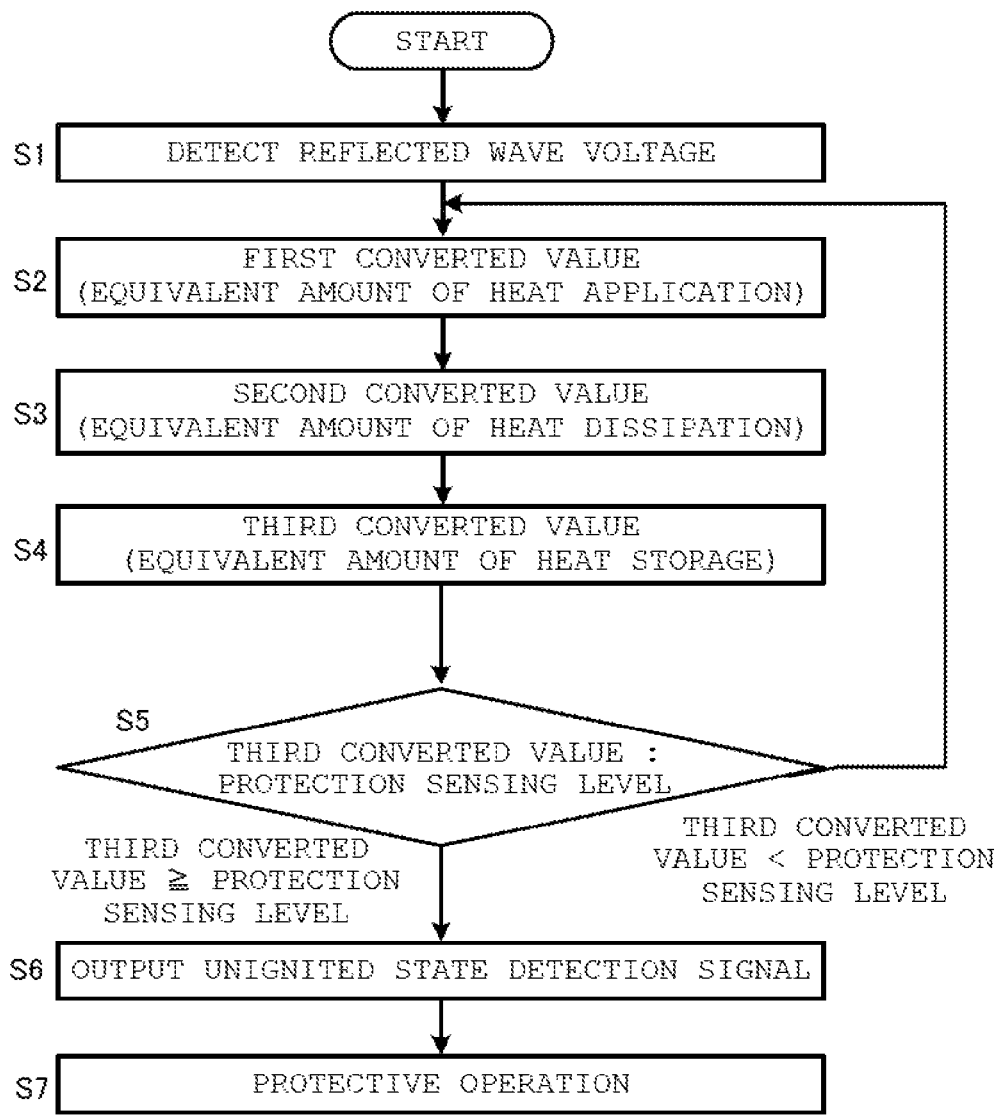
FIG. 5 is a flowchart illustrating steps of detecting the unignited state according to the present invention.

The first conversion means 11A inputs the reflected wave voltage $V_r$ (S1 in FIG. 5) detected by the power sensor, and on the basis of the reflected wave voltage $V_r$ and a duration time of the reflected wave voltage $V_r$, the first converted value (equivalent value of applied heat) is obtained, which corresponds to an amount of heat applied to the RF power amplifier element of the RF power source (S2 in FIG. 5).

The second conversion means 11B obtains, in every cycle of pulse driving, a second converted value corresponding to the amount of heat dissipation from the RF power amplifier element of the RF power source, on the basis of an elapsed time from when the peak value of the reflected wave voltage $V_r$ becomes zero, or an elapsed time from a start of applying the pulse output.

In the mode where the second converted value is obtained on the basis of the elapsed time from when the peak value of the reflected wave voltage $V_r$ becomes zero, the conversion is performed under the assumption that the amount of heat dissipation from the RF power amplifier element mostly corresponds to the amount of heat dissipation while application of the reflected wave to the RF power amplifier element is stopped and thus the amount of heat dissipation during the period when the reflected wave is applied to the RF power amplifier element is just a small amount.

On the other hand, in the mode where the second converted value is obtained on the basis of the elapsed time from starting application of the pulse output, the conversion is performed considering the amount of heat dissipation during the period when the reflected wave is applied to the RF power amplifier element (S3 in FIG. 5).

The third conversion means 11C obtains a third converted value (an equivalent amount of heat storage), corresponding to the amount of heat storage in the RF power amplifier element of the RF power source, on the basis of a difference between the first converted value and the second converted value (54 in FIG. 5).

The comparison means 12 compares the third converted value obtained by the third conversion means 11C with a threshold in association with an allowable heat quantity of the RF power amplifier element. The threshold represents a device protection sensing level for protecting the RF power amplifier element, and when the third converted value reaches or exceeds the threshold, it is determined that the amount of heat accumulated in the RF power amplifier element reaches or exceeds the device protection sensing level of the RF power amplifier element (S5 in FIG. 5), and the unignited plasma state is detected (S6 in FIG. 5).

In the case where the unignited plasma state is detected, the power controller performs drooping or suspension control of the radio frequency output (RF output), thereby executing a protecting operation (S7 in FIG. 5).

Power supplying from the RF power source by pulse driving may be described according to two pulse modes; low-frequency pulse mode and high-frequency pulse mode, on the basis of whether or not an amount of the heat storage still remains at the end of the period, as a result of dissipating the amount of heat being applied in one cycle of the pulse driving.

In the low-frequency pulse mode, a period of pulse driving includes a sufficiently long time width of time for dissipating an amount of heat having been applied, and at the end of the period of pulse driving, there is no remaining amount of heat storage. In this mode, an equivalent amount of heat storage is equal to zero. The equivalent amount of heat storage converted in the low-frequency pulse mode starts summation from an initial value being zero in every cycle of pulse driving.

On the other hand, in the high-frequency pulse mode, a period of the pulse drive does not include a time length long enough to dissipate the total amount of heat being applied, and at the end of the period of pulse driving, there still remains an amount of heat storage. In this mode, an equivalent amount of heat storage still remains. The equivalent amount of heat storage converted in the high-frequency pulse mode starts summation from an initial value which is the heat storage converted value at the end of the previous period, in every cycle of pulse driving.

Under the condition of pulse driving where the duty ratio of the pulse output is equal and also the peak value of a reflected wave voltage is equal, if one cycle T of pulse driving is long and the amount of accumulated heat at the end of one cycle is zero, the pulse is in the low-frequency mode, whereas if one cycle T of pulse driving is short and an amount of heat storage still remains at the end of one cycle, the pulse is in the high-frequency mode.

The low-frequency mode and the high-frequency mode in the ignited state will be described, with reference to the signal diagram as shown in FIG. 3, and the low-frequency mode and the high-frequency mode in the unignited state will be described with reference to the signal diagram as shown in FIG. 4.

In the plasma ignited state, FIG. 3A to FIG. 3D illustrate respectively, forward wave voltage $V_f$, reflected wave voltage $V_r$, an equivalent amount of heat storage $H_{ac}$, and an unignited state detection signal in the low-frequency pulse mode, FIG. 3E to FIG. 3H illustrate the forward wave voltage $V_f$, the reflected wave voltage $V_r$, the equivalent amount of heat storage $H_{ac}$, and the unignited state detection signal in the high-frequency pulse mode.

The forward wave voltage $V_f$ delivers the pulse output at a predetermined frequency, in the $RF_{on}$ interval having a duration of time $t_1$ in one cycle (FIG. 3A and FIG. 3E). If the plasma is ignited normally, a mismatch at a rise and a fall of the pulse output may cause pulse-like reflected wave voltage $V_r$ (FIG. 3B and FIG. 3F).

In FIG. 3C and FIG. 3G, the equivalent amount of heat storage $H_{ac}$ indicates a converted value of an amount of heat that is accumulated while the reflected wave voltage $V_r$ is applied to the RF power amplifier element, and the dashed-dotted line indicates an allowable amount against thermal failure in the RF power amplifier elements, representing a device protection sensing level for protecting the RF power amplifier element against a damage due to the reflected wave.

In the case where the plasma is in the ignited state, in any of the low frequency mode and the high frequency mode, the equivalent amount of heat storage $H_{ac}$ returns to zero without reaching the device protection sensing level in every period of the driving mode, and therefore, no unignited state detection signal is outputted.

On the other hand, when the plasma is in the unignited state, FIG. 4A to FIG. 4D illustrate respectively, the forward wave voltage $V_f$, the reflected wave voltage $V_r$, the equivalent amount of heat storage $H_{ac}$, and the unignited state detection signal $V_{fail}$ in the low-frequency pulse mode, and FIG. 4E to FIG. 4H illustrate respectively, the forward wave voltage $V_f$, the reflected wave voltage $V_r$, the equivalent amount of heat storage $H_{ac}$, and the unignited state detection signal $V_{fail}$ in the high-frequency pulse mode.

Figure 4A:
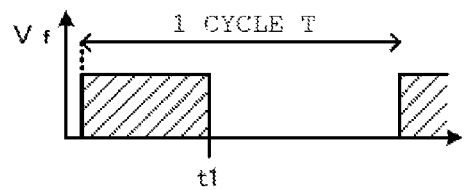
FIG. 4 illustrates signal diagrams showing the unignited state according to the present invention.
Figure 4E:
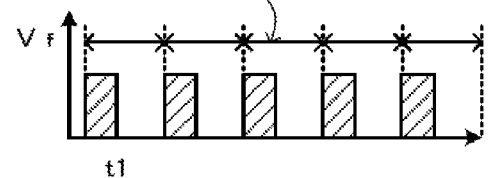
Figure 4B:
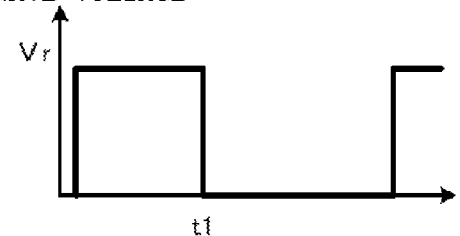
Figure 4F:
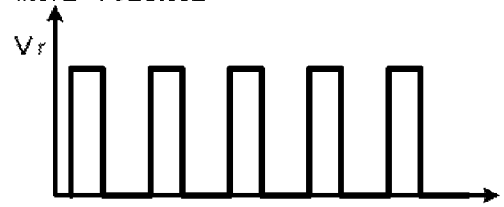

The forward wave voltage $V_f$ delivers the pulse output at a predetermined frequency, in the $RF_{on}$ interval having a duration of time $t_1$ in one cycle (FIG. 4A and FIG. 4E). If the plasma has not been ignited yet, a rectangular-like reflected wave voltage $V_r$ is generated in the $RF_{on}$ interval when the pulse output is delivered (FIG. 4B and FIG. 4F).

Figure 4C:
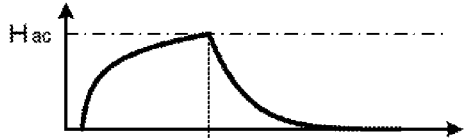
Figure 4G:
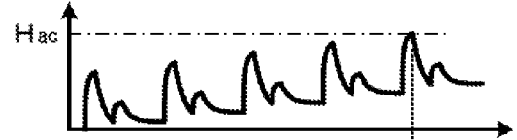

In FIG. 4C and FIG. 4G, the equivalent amount of heat storage $H_{ac}$ indicates a converted value of heat that is accumulated while the reflected wave voltage $V_r$ is applied to the RF power amplifier element, and the dashed-dotted line indicates the allowable amount against thermal failure of the RF power amplifier element, representing a device protection sensing level for protecting the RF power amplifier element against a damage due to the reflected wave.

Figure 4D:
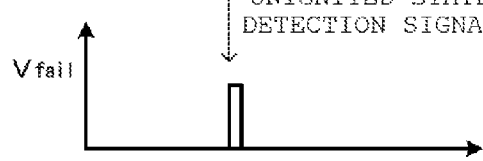

When the plasma is in the unignited state, in the low frequency mode, the equivalent amount of heat storage $H_{ac}$ reaches the device protection sensing level within the period of the driving mode (FIG. 4C), and therefore, an unignited state detection signal $V_{fail}$ is outputted (FIG. 4D). FIG. 4C shows the case where the equivalent amount of heat storage $H_{ac}$ reaches the device protection sensing level at the end of the $RF_{on}$ interval. However, if the peak value of the reflected wave voltage $V_r$ is large, the equivalent amount of heat storage $H_{ac}$ reaches the device protection detection level at a point before the end of the $RF_{on}$ interval, and the ignition determination signal $V_{fail}$ is outputted.

Figure 4H:
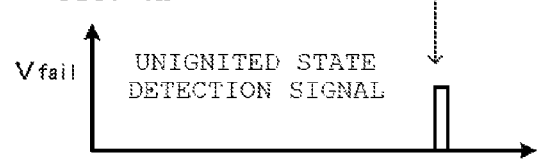

In the high frequency mode, storing of heat is repeated over plural periods, and the equivalent amount of heat storage $H_{ac}$ reaches the device protection sensing level accordingly (FIG. 4G), and then, the ignition determination signal $V_{fail}$ is outputted (FIG. 4H). FIG. 4G shows that the equivalent amount of heat storage $H_{ac}$ reaches the device protection sensing level in the fifth period. However, in what period number the equivalent amount of heat storage $H_{ac}$ reaches the device protection sensing level may vary depending on the peak value and the duty ratio of the reflected wave voltage $V_r$.

[Mode for Detecting the Unignited State by the Use of Charging and Discharging Voltage of a Reflected Wave Voltage Value]

Figure 6A:
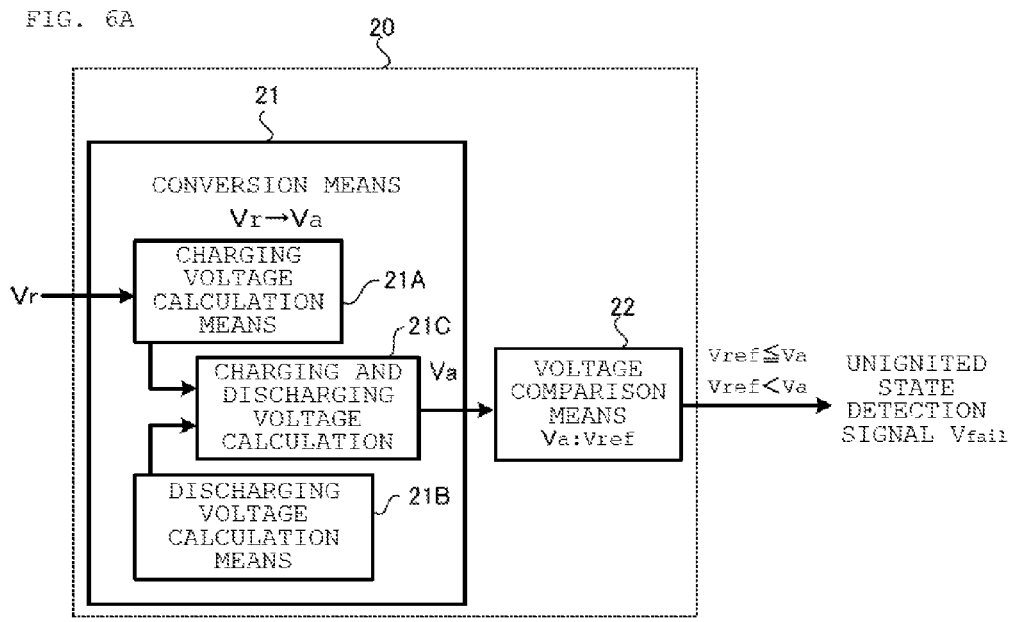
FIG. 6 illustrates a schematic configuration for detecting the unignited state by using a voltage value of a reflected wave according to the present invention.
Figure 6B:
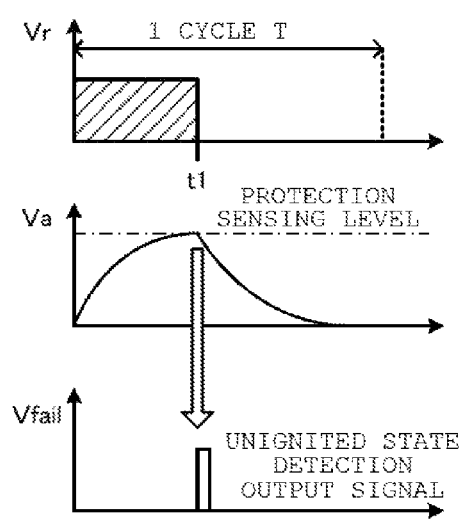
Figure 6C:
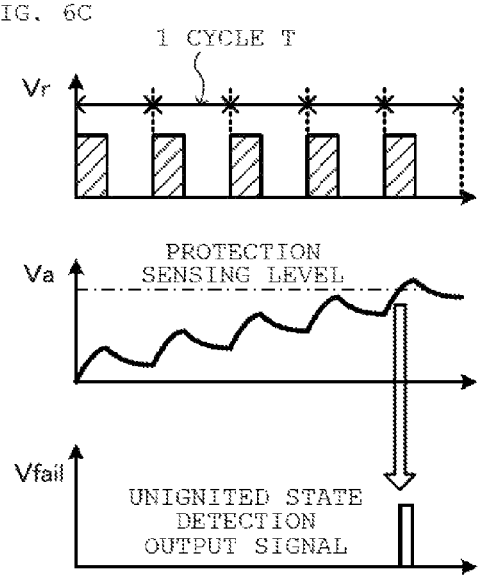

A schematic configuration for detecting the unignited state by the use of charging and discharging of a reflected wave voltage value, will now be described with reference to FIG. 6.

The unignited state detection device 20 has a configuration to obtain a voltage value in association with a duration of time of the reflected wave and detect the unignited plasma state, by the use of charging and discharging of the voltage value of the reflected wave, and the device is provided with a conversion means 21 and a voltage comparison means 22.

It is further provided with a charging voltage calculation means 21A configured to calculate charging voltage by charging the reflected wave voltage $V_r$, a discharging voltage calculation means 21B configured to calculate discharging voltage, and a charging and discharging voltage calculation means 21C configured to calculate a difference between the charging voltage and the discharging voltage, so as to obtain the charging and discharging voltage $V_a$.

A calculated value by the charging voltage calculation means 21A corresponds to the first converted value (equivalent amount of heat application), a calculated value by the discharging voltage calculation means 21B corresponds to the second converted value (equivalent amount of heat dissipation), and the charging and discharging voltage $V_a$ calculated by the charging and discharging voltage calculation means 21C corresponds to the third converted value (equivalent amount of heat storage).

The voltage comparison means 22 compares the charging and discharging voltage $V_a$ obtained by voltage conversion by the conversion means 21, with a threshold.

As the threshold, set voltage $V_{ref}$ is used. The set voltage $V_{ref}$ is allowable voltage being associated with allowable power that tolerates a loss of the RF power amplifier element, caused by the reflected wave.

The voltage comparison means 22 detects the unignited plasma state by comparing the charging and discharging voltage $V_a$ with the set voltage $V_{ref}$, and outputs an unignited state detection signal $V_{fail}$ when the unignited state is detected.

The conversion means 21 and the voltage comparison means 22 detect the unignited state, in the low-frequency pulse mode and in the high-frequency pulse mode.

In pulse driving of the low-frequency pulse mode, the conversion means 21 acquires the charging and discharging voltage $V_a$ in association with the duration of time of the reflected wave voltage $V_r$ in one cycle, and the voltage comparison means 22 compares the charging and discharging voltage $V_a$ with the set voltage $V_{ref}$, thereby detecting the unignited plasma state and outputting the unignited state detection signal $V_{fail}$.

On the other hand, in pulse driving of the high-frequency pulse mode, the conversion means 21 acquires the charging and discharging voltage $V_a$ obtained by accumulating voltage in association with the duration of time of the reflected wave voltage $V_r$ in every period, over the continuous periods when the reflected wave is generated, and the voltage comparison means 22 compares the charging and discharging voltage $V_a$ with the set voltage $V_{ref}$, thereby detecting the unignited plasma state and outputting the unignited state detection signal $V_{fail}$.

(Mode for Detecting the Unignited State on the Basis of Charging and Discharging Voltage of Reflected Wave Voltage)

In detecting the unignited state on the basis of reflected wave voltage, a configuration example for obtaining the reflected wave voltage according to the charging and discharging voltage will now be described with reference to FIGS. 7 to 17.

With reference to FIG. 7, an example will be described, which configures a circuit for detecting the unignited state on the basis of charging and discharging voltage of the reflected wave voltage, employing the charging and discharging circuit which is an RC circuit.

The unignited state detection circuit $20_{circuit}$ inputs the reflected wave voltage $V_r$ detected by the power sensor 2 via the buffer 4, and outputs an unignited state detection signal $V_{fail}$. The unignited state detection circuit $20_{circuit}$ is provided with a charging and discharging circuit 20a and a comparator 20b, and the charging and discharging circuit 20a inputs the output from the buffer 4, via the block diode D.

The charging and discharging circuit 20a is configured by connecting a charging and discharging resistance $R_1$ in series with the input side of the parallel circuit of the capacitor C and the discharging resistance $R_2$. The comparator 20b compares the charging and discharging voltage $V_a$ being the output voltage from the capacitor C in the charging and discharging circuit 20a, with the set voltage $V_{ref}$, and outputs the unignited state detection signal $V_{fail}$ when the charging and discharging voltage $V_a$ reaches or exceeds the set voltage $V_{ref}$. In the charging and discharging circuit 20a, the charging time constant $\tau_c$ is set to be shorter than the discharging time constant $\tau_{disc}$. In addition, the charging time constant $\tau_c$ is set in such a manner that the charging voltage becomes equal to or less than the set voltage $V_{ref}$, when charging is performed in the time length of the period T of the low-frequency pulse mode. The charging time constant $\tau_c$ and the discharging time constant $\tau_{disc}$ can be set by selecting values of the charging and discharging resistance $R_1$, the discharging resistance $R_2$, and the capacitor C.

(Operation Example in a Normal Time)

Figure 8:
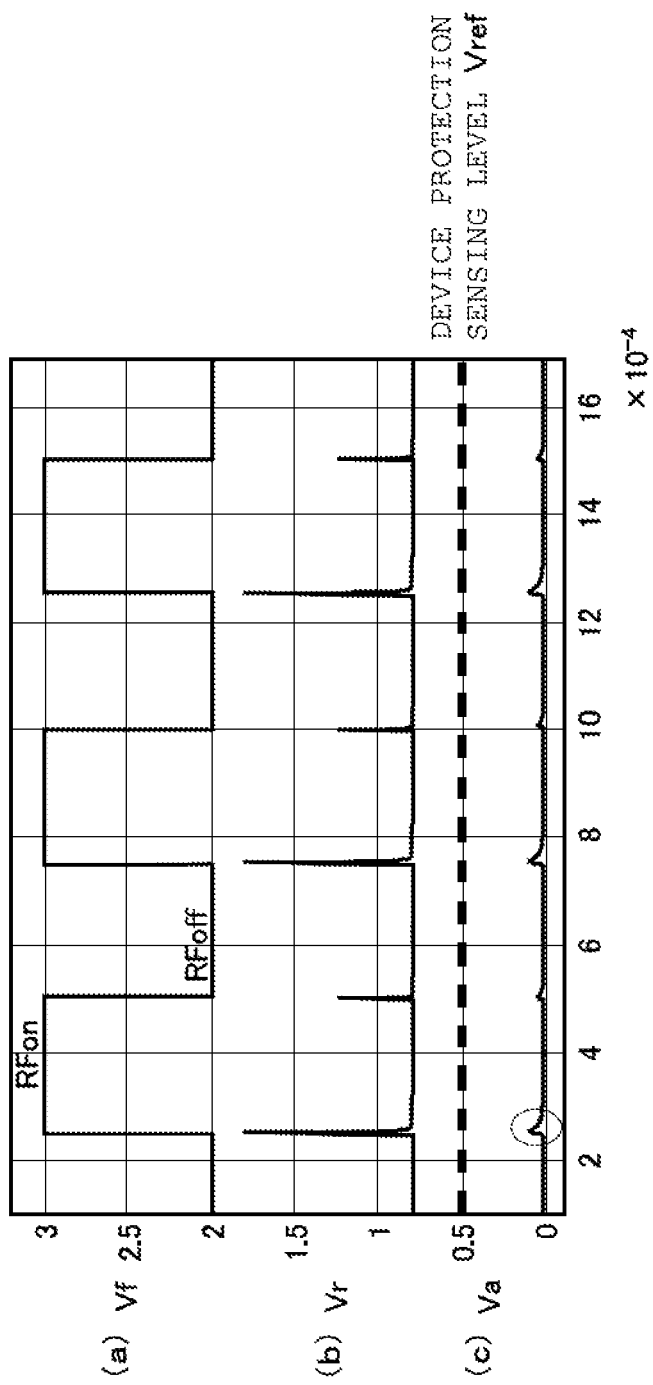
FIG. 8 illustrates a signal example of a normal operating state in a low-frequency pulse mode.
Figure 9:
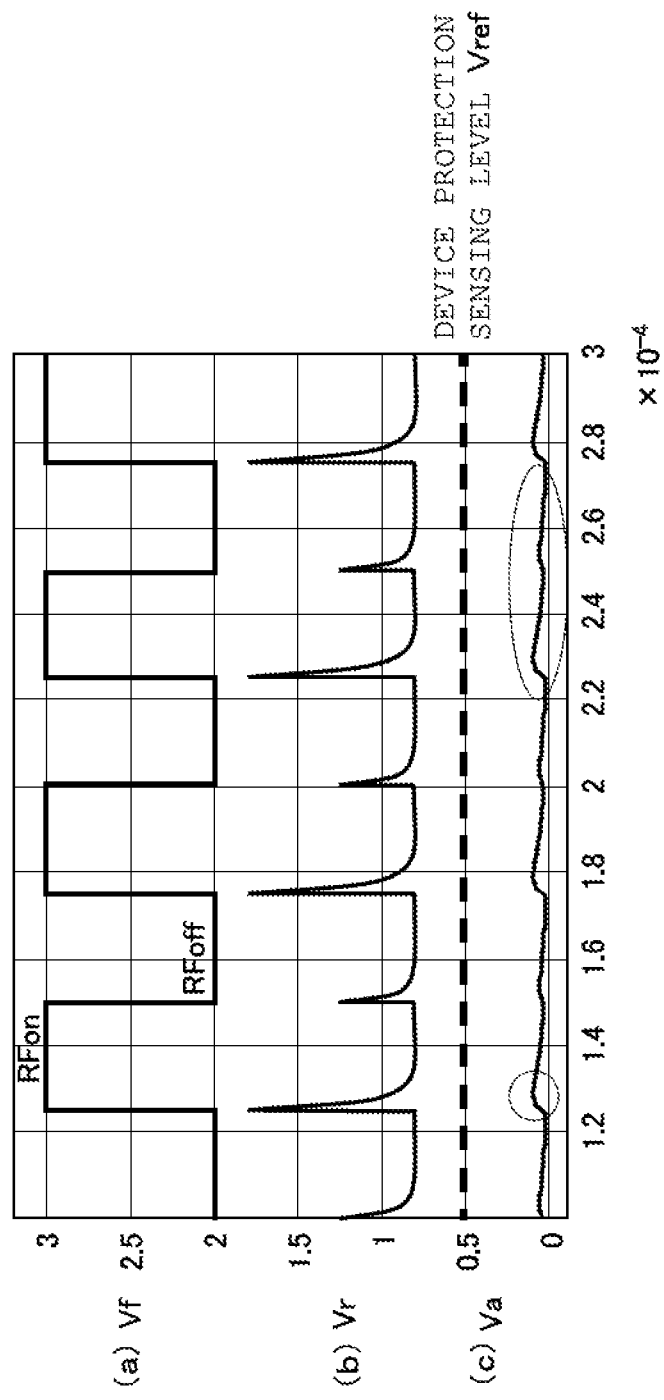
FIG. 9 illustrates a signal example of the normal operating state in a high-frequency pulse mode.

With reference to FIGS. 8 and 9, an operation example of the unignited state detection device 20 in a normal time will described. FIG. 8 illustrates a signal example of the normal operation state of the low-frequency pulse mode where; FIG. 8(a) illustrates the forward wave voltage $V_f$, FIG. 8 (b) illustrates the reflected wave voltage $V_r$, and FIG. 8(c) illustrates the charging and discharging voltage $V_a$ in the charging and discharging circuit. The example here shows the case where the duty ratio of pulse driving is 50%.

FIG. 9 illustrates a signal example of the normal operation state of the high-frequency pulse mode where; FIG. 9(a)

illustrates the forward wave voltage $V_f$, FIG. 9(b) illustrates the reflected wave voltage $V_r$, and FIG. 9(c) illustrates the charging and discharging voltage $V_a$ in the charging and discharging circuit. The example here shows the case where the duty ratio of pulse driving is 50%.

Even in the normal state, reflected wave voltage $V_r$ is generated at a rise and a fall of the $RF_{on}$ interval, when the forward wave voltage $V_f$ is switched from the off-state to the on-state and when the forward wave voltage $V_f$ is switched from the on-state to the off-state (at the time of plasma ignition).

The circuit constants (charging and discharging resistance $R_1$, discharging resistance $R_2$, and capacitor C) of the charging and discharging circuit are selected, in such a manner that the charging time constant $\tau_c$ allows the charging and discharging voltage $V_a$ of the charging and discharging circuit to have a margin with respect to the set voltage $V_{ref}$, under the condition that pulse driving is performed with setting the pulse frequency to be a maximum and the duty ratio of the $RF_{on}$ interval and the $RF_{off}$ interval in one cycle to be a maximum.

In the charging and discharging circuit configuration of the RC circuit as shown in FIG. 7, the charging time constant $\tau_c$ is expressed by:

$$\tau_c = C \cdot R_p$$

$$R_p = R_1 \cdot R_2/(R_1 + R_2)$$

and the discharging time constant $\tau_{disc}$ is expressed by:

$$\tau_{disc} = C \cdot R_2$$

Since the reflected wave voltage $V_r$ is generated within a short time in the normal state, a peak value of the charging and discharging voltage $V_a$ obtained by the charging and discharging circuit, is sufficiently lower than the set voltage $V_{ref}$ being the unignited state detection level, and the unignited state detection signal is not outputted.

(Operation Example in an Abnormal Time)

Figure 10:
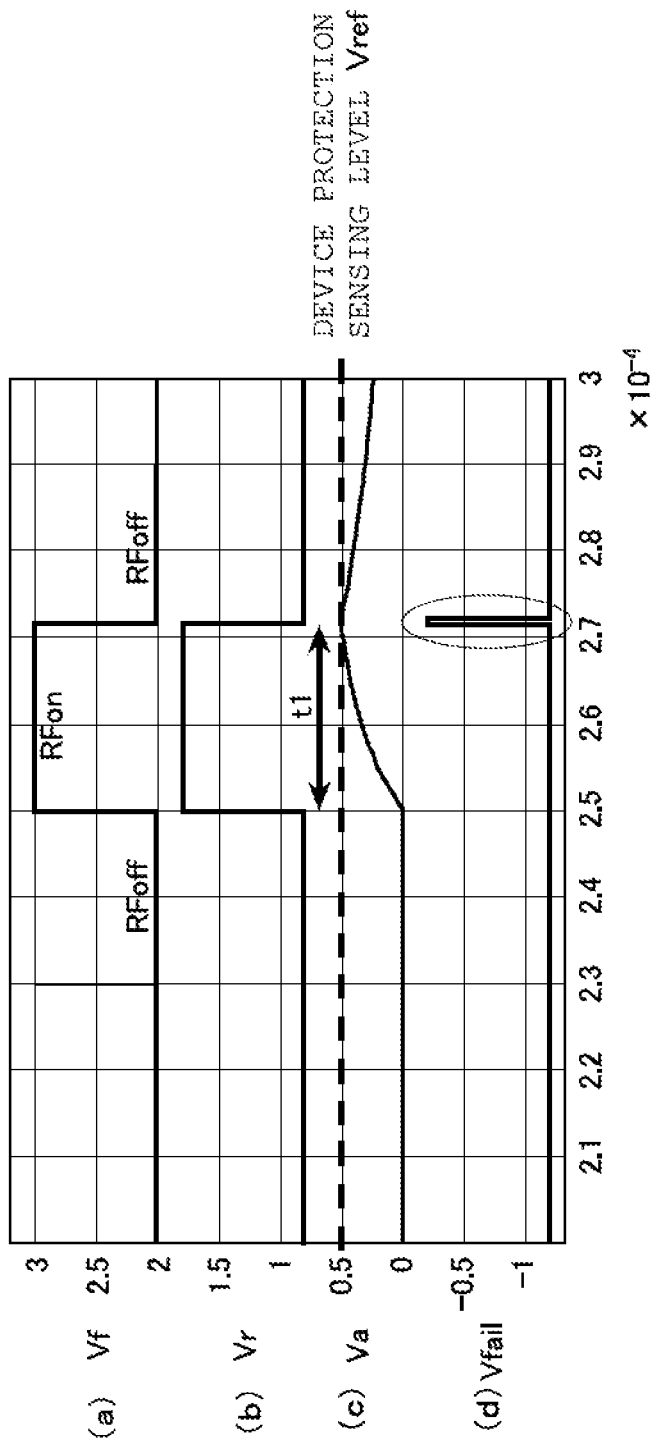
FIG. 10 illustrates a signal example of an abnormal operating state in the low-frequency pulse mode.
Figure 11:
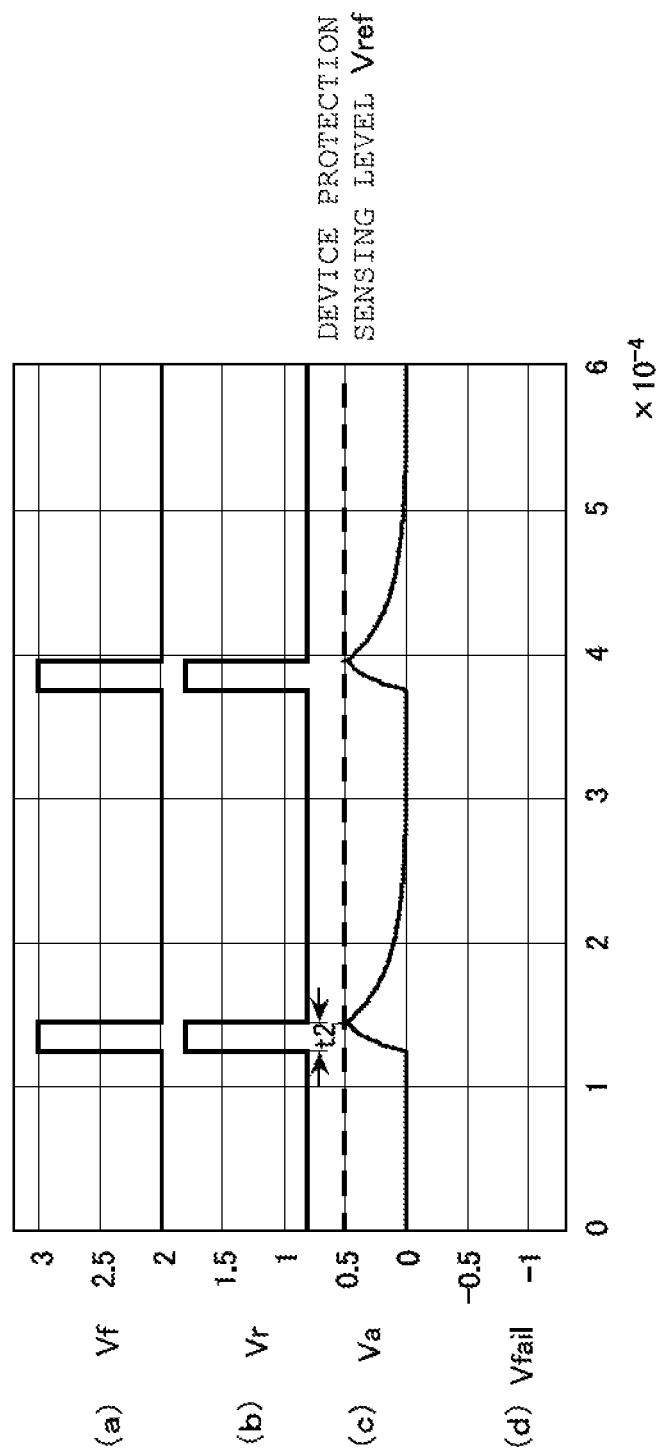
FIG. 11 illustrates an allowable on-time $t_2$.
Figure 12:
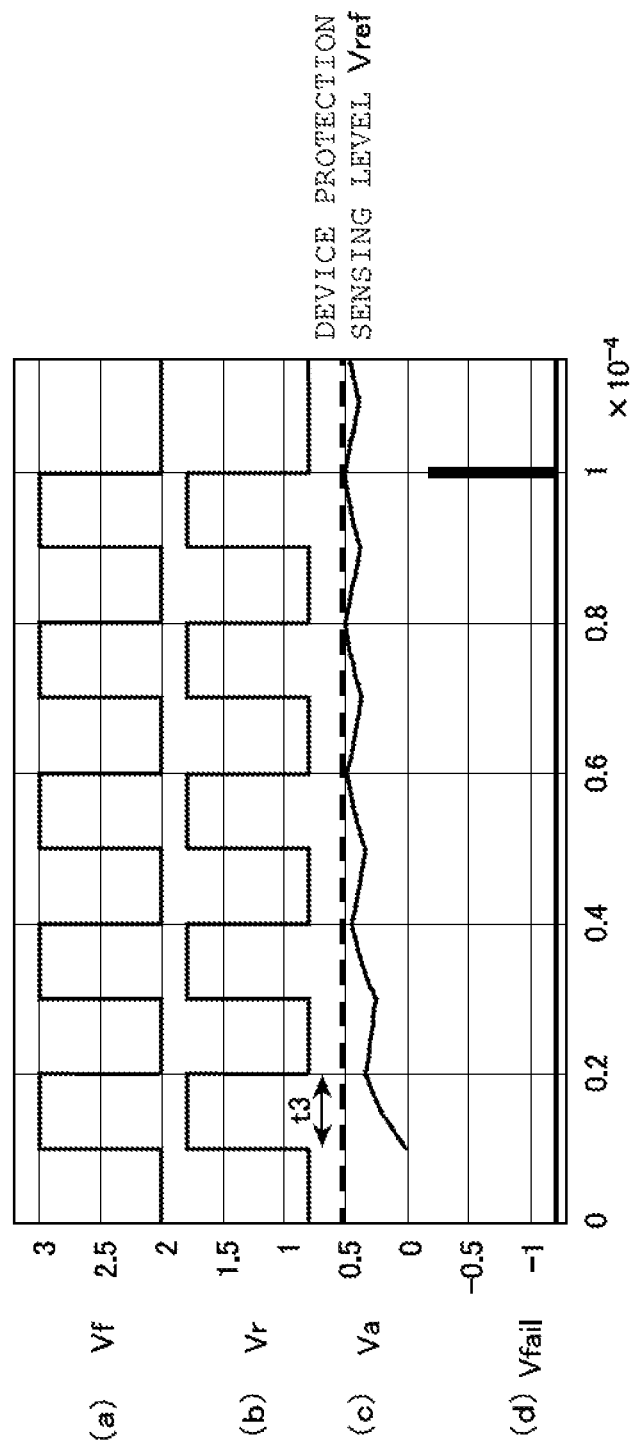
FIG. 12 illustrates a signal example of the abnormal operation state in the high-frequency pulse mode.

With reference to FIGS. 10 to 12, an operation example at the abnormality of the unignited state detection device 20 will be described. FIG. 10 shows a signal example of an abnormal operation state of low-frequency pulse mode; where FIG. 10(a) illustrates the forward wave voltage $V_f$, FIG. 10(b) illustrates the reflected wave voltage $V_r$, FIG. 10(c) illustrates the charging and discharging voltage $V_a$ in the charging and discharging circuit, and FIG. 10(d) illustrates the unignited state detection signal $V_{fail}$. The example here shows the case where the duty ratio of pulse driving is 50%.

The set voltage $V_{ref}$ is provided, considering a margin component with respect to the allowable loss (damage level) of the RF power amplifier element. It should be noted that the set voltage $V_{ref}$ is a value that depends on a voltage value of the reflected wave and the charging time constant $\tau_c$. When the charging and discharging voltage $V_a$ obtained by charging a reflected wave voltage reaches the set voltage $V_{ref}$ being the device protection sensing level, after a lapse of the duration of time $t_1$, the unignited state detection signal is outputted. The power controller performs control for drooping or suspension of the radio frequency output (RF output) on the basis of the unignited state detection signal.

FIG. 11 is a signal diagram for describing allowable on-time $t_2$ of the unignited state detection device 20. FIG. 11(a) illustrates the forward wave voltage $V_f$, FIG. 11(b) illustrates the reflected wave voltage $V_r$, FIG. 11(c) illustrates the charging and discharging voltage $V_a$ in the charging and discharging circuit, and FIG. 11(d) illustrates the unignited state detection signal $V_{fail}$.

The allowable on-time $t_2$ indicates a time width that accepts allowable voltage of the total reflection on the RF power amplifier element. If the time width (duration $t_1$) of the reflected wave applied to the RF power amplifier element is equal to or less than the allowable on-time $t_2$, and if the charging and discharging voltage $V_a$ is zero at the end of a period of pulse driving, i.e., in the low-frequency pulse mode, even though a reflected wave (in the unmatching state where a reflection coefficient $\Gamma$ is approximately 1 ($\Gamma \approx 1$)) is generated, the RF power amplifier element may not come to the element destruction due to total reflection. Therefore, it is possible to continue applying the forward wave voltage without drooping or suspension of the radio frequency output (RF output).

Therefore, in the case where the duration of time $t_1$ of the reflected wave is shorter than the allowable on-time $t_2$, and the charging and discharging voltage $V_a$ is zero at the end of the pulse driving period, that is, in the low-frequency pulse mode, the charging and discharging voltage $V_a$ does not reach the set voltage $V_{ref}$ being the device protection sensing level, and thus the unignited state detection signal is not outputted.

In the case where a device with a plasma load, such as a laser beam machine, is kept non-operated for a long period of time, moisture or the like, may be generated in plasma atmosphere in a laser oscillator, or the like, and this may lead to the atmosphere that makes plasma ignition more difficult. In such plasma atmosphere where igniting is difficult, the time width of the reflected wave applied to the RF power amplifier element is set to be equal to or shorter than the allowable on-time $t_2$, so as not to cause drooping nor suspension of the radio frequency output (RF output), thereby enabling repetitive application of the radio frequency output (RF output) when the plasma is not ignited yet. As described above, by repeatedly applying the radio frequency output (RF output), the atmosphere inside the laser oscillator is stabilized with prompting the ignition.

FIG. 12 shows a signal example of the abnormal operation state in the high-frequency pulse mode; where FIG. 12(a) illustrates the forward wave voltage $V_f$, FIG. 12(b) illustrates the reflected wave voltage $V_r$, FIG. 12(c) illustrates the charging and discharging voltage $V_a$ of the charging and discharging circuit, and FIG. 12(d) illustrates the unignited state detection signal $V_{fail}$. The example here shows the case where the duty ratio of pulse driving is 50%.

In the high-frequency pulse mode, the time width when the forward wave voltage $V_r$ is applied is short, and during anomalies, the time width $t_3$ of the reflected wave is also short. The charging and discharging voltage $V_a$ charged in the time width $t_3$ according to the charging time constant $\tau_c$ is lower than the voltage charged during one period T in the low-frequency pulse mode, and it does not reach the set voltage $V_{ref}$.

Since the charging time constant $\tau_r$ of the charging and discharging circuit is set to be smaller than the discharging time constant $\tau_{disc}$ (charging time constant $\tau_c$<discharging time constant $\tau_{disc}$), voltage after discharging in one period does not return to zero, and repeating application of pulse output over plural periods may accumulate the charging and discharging voltage $V_a$ and raise the voltage. When the charging and discharging voltage $V_a$ reaches the set voltage $V_{ref}$, the unignited state detection signal $V_{fail}$ is outputted.

Figure 13:
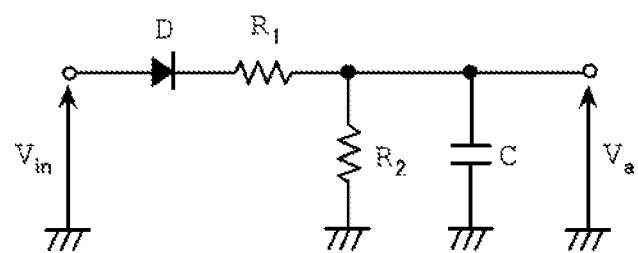
FIG. 13 illustrates a circuit configuration of a charging and discharging circuit 20a of an unignited state detection circuit $20_{circuit}$.
Figure 14:
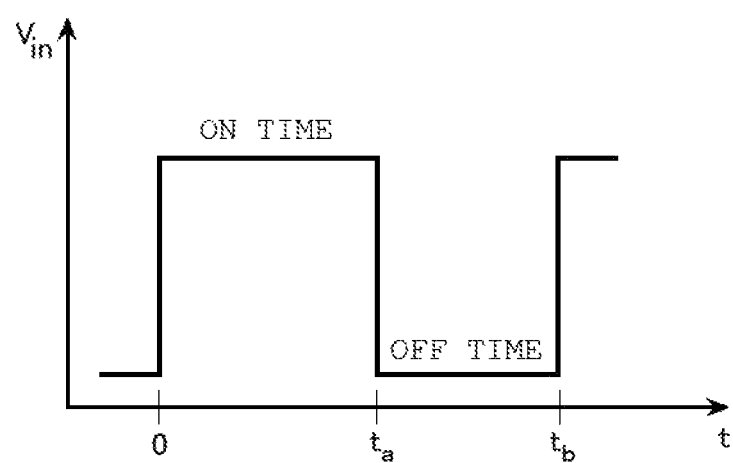
FIG. 14 illustrates an example of input voltage $V_{in}$.

Charging and discharging voltage and accumulated charging and discharging voltage in the charging and discharging circuit will now be described. FIG. 13 illustrates a circuit configuration of the charging and discharging circuit 20*a* in the unignited state detection circuit 20*_{circuit}* as shown in FIG. 7. The charging and discharging circuit 20*a* is configured by connecting the charging and discharging resistance $R_1$ in series with the input side of a parallel circuit consisted of the capacitor C and the discharging resistance $R_2$, and input voltage $V_{in}$ is inputted in the charging and discharging resistance $R_1$, via the block diode D, and the voltage across the capacitor C is outputted as the charging and discharging voltage $V_a$. FIG. 14 shows one example of the input voltage $V_{in}$, and assuming the on-time width as $t_a$ and the off-time width as $(t_b-t_a)$, pulses at a predetermined frequency are outputted during the on-time width $t_a$.

Since the circuit configuration of the charging and discharging circuit 20*a* is a nonlinear circuit provided with a diode, an analysis is carried out separately in the following states; in the state where there is an input signal (RF signal is on) and in the state where there is no input signal (RF signal is off).

Figure 15:
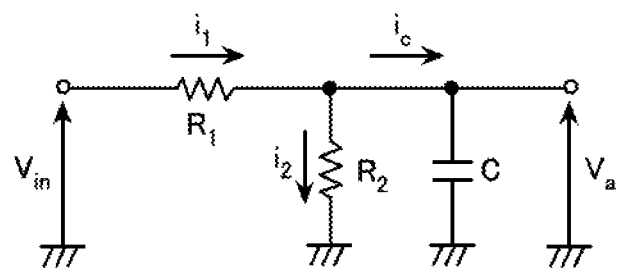
FIG. 15 illustrates the circuit state when there is an input signal (in the state where RF signal is on)

FIG. 15 illustrates a circuit state where there is an input signal (when the RF signal is on). In the circuit state as shown in FIG. 15, a circuit equation is expressed as the following formulas 1 to 4, where charging and discharging voltage is $V_a$, the current passing through the charging and discharging resistance $R_1$ is $i_1$, the current passing through the discharging resistance $R_2$ is $i_2$, and the current passing into the capacitor C is $i_c$:

$$v_a(t1) = \frac{1}{c}\int_0^{t1} i_c(t)\,dt + v_a(0) \tag{1}$$

$$i_1(t) = i_2(t) + i_c(t) \tag{2}$$

$$i_1(t) = \frac{v_{in}(t) - v_a(t)}{R_1} \tag{3}$$

$$i_2(t) = \frac{v_a(t)}{R_2} \tag{4}$$

Assuming the input voltage $V_{in}$ as the step voltage $E_m$, charging and discharging voltage $V_a(t_1)$ is obtained in the $RF_{on}$ interval (0 to $t_1$) when the RF signal is on, and it is expressed by the following formula 5.

$$v_a(t1) = \frac{R_1 R_2}{R_1 + R_2}\left(1 - e^{-\frac{1}{CR_p}t1}\right) \tag{5}$$

In the formula 5, assuming that $R_p=R_1\cdot R_2/(R_1+R_2)$, the charging time constant is represented by $C\cdot R_p$.

Figure 16:
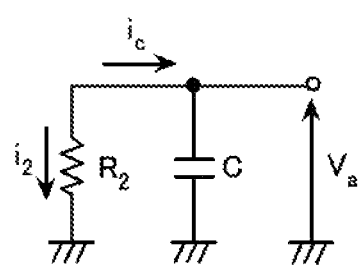
FIG. 16 illustrates the circuit state when there is no input signal (in the state where RF signal is off)

On the other hand, FIG. 16 illustrates a circuit state when there is no input signal (when the RF signal is off). In the circuit state as shown in FIG. 16, a circuit equation is expressed as the following formulas 6 and 7, where charging and discharging voltage is $V_a$, current passing through the discharging resistance $R_2$ is $i_2$, and current passing into the capacitor C is $i_c$:

$$v_a(t2) = \frac{1}{C}\int_{t1}^{t2} i_c(t)\,dt + v_a(t1) \tag{6}$$

$$i_c(t) = -i_2(t) = -\frac{v_a(t)}{R_2} \tag{7}$$

By using the formulas 6 and 7, the charging and discharging voltage $V_a$ when the RF signal is off is expressed by the following formula 8:

$$v_a(t2) = v_a(t1)e^{-\frac{1}{CR_2}t2} \tag{8}$$

There are provided following numerical values for the charging and discharging voltage $V_a$ as expressed by the formula 5 when the RF signal is on, and the charging and discharging voltage $V_a$ as expressed by the formula 8 when the RF signal is off:

Pulse frequency of input voltage $V_{in}$: 50 kHz
ON duty ratio of input voltage $V_{in}$: 30%
Charging and discharging resistance $R_1$: 1.8Ω
Discharging resistance: 3.6Ω
Capacitance of capacitor C: 0.01 μF Those numerical values are used for dissolution by the Euler's method at a fixed time step of 0.01 μs, and the waveform as shown in FIG. 17 is obtained.

A configuration of the unignited state detection device is not limited to an analogue circuit as described so far, but it may be configured by digital operation processing such as DSP and FPGA. If software is employed, the device may be configured by a CPU, a memory, and the like, which stores programs to instruct the CPU to perform processing for detecting the unignited state.

(Configuration Example According to Digital Operation Processing)

Figure 18A:
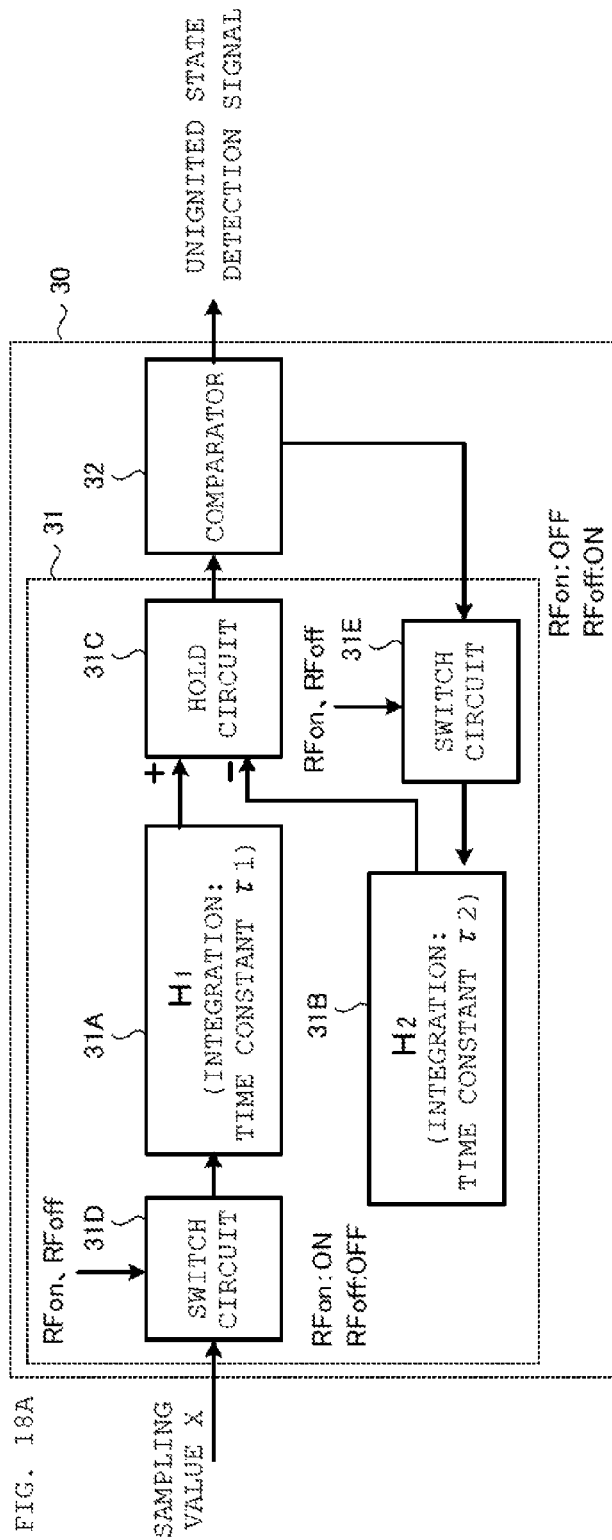
FIG. 18 illustrates an example where the unignited state detection device of the present invention is configured by a digital circuit.
Figure 18B:
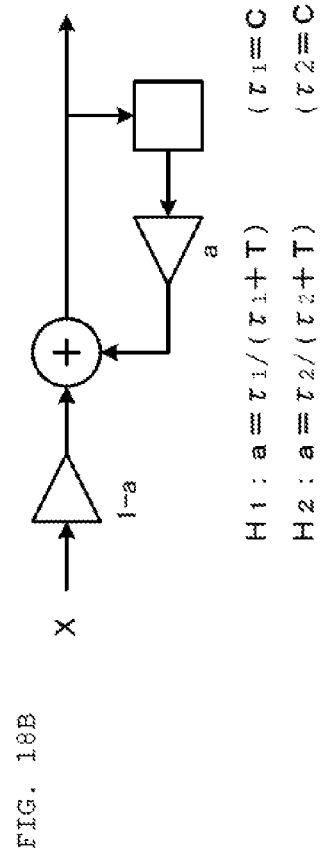
Figure 19:
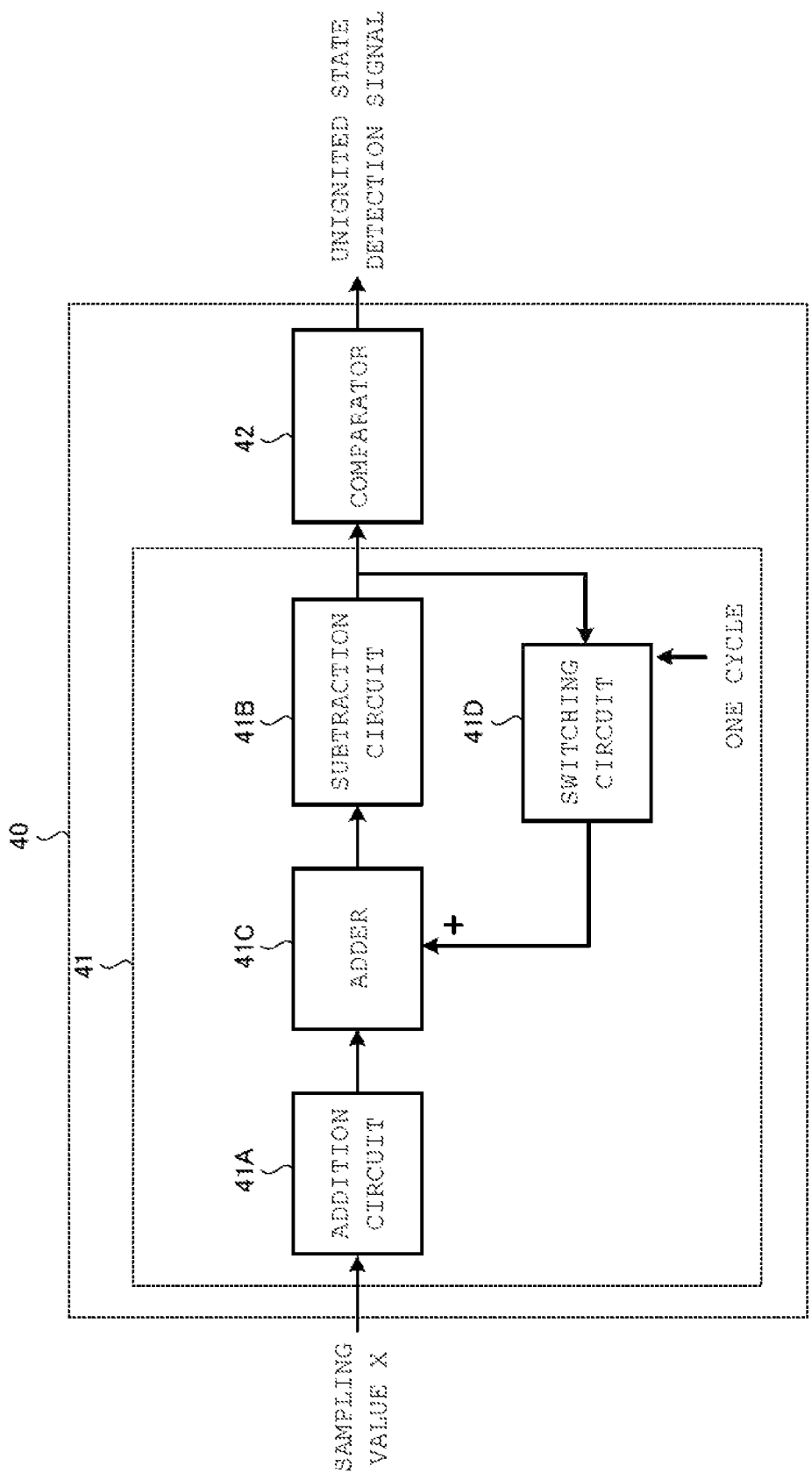
FIG. 19 illustrates an example where the unignited state detection device of the present invention is configured by a counting circuit.
Figure 20:
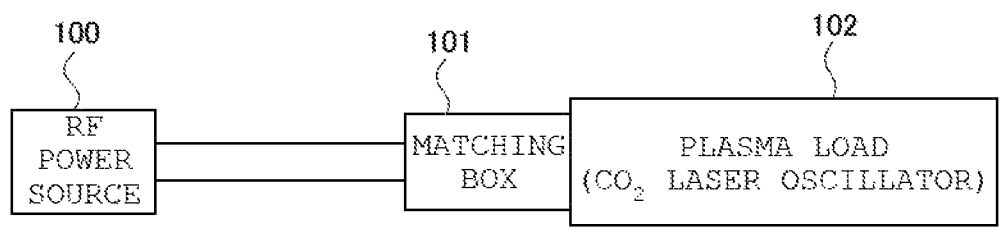
FIG. 20 is a schematic view illustrating a plasma load driving by a radio-frequency power source (RF power source).

With reference to FIGS. 18 and 19, an example for configuring the unignited state detection device by digital operation processing will now be described.

First Configuration Example

FIG. 18 is an example configuring the unignited state detection device by a digital circuit. In the example here, it is shown that the digital circuit configures the aforementioned charging and discharging circuit.

In FIG. 18A, a conversion means 31 of the unignited state detection device 30 is provided with, a first integrating circuit 31A, a second integrating circuit 31B, a hold circuit 31C, switching circuits 31D and 31E, and a comparator 32 is also provided.

The switching circuit 31D inputs a voltage value X obtained by sampling the reflected wave voltage and by performing A/D conversion, into the first integrating circuit 31A, only during the $RF_{on}$ interval. The first integrating circuit 31A digitally integrates the voltage value X inputted via the switching circuit 31D, and calculates a first converted value corresponding to an amount of heat that is applied to the RF power amplifier element of the RF power source.

The second integrating circuit 31B digitally integrates a voltage component lowered by discharging only within the $RF_{off}$ interval, and calculates a second converted value corresponding to an amount of heat dissipated from the RF power amplifier element of the RF power source.

The hold circuit 31C inputs the first converted value of the first integrating circuit 31A and the second converted value of the second integrating circuit 31B, obtains a difference between the first converted value and the second converted value, and then outputs a third converted value to the comparator 32. The comparator 32 compares the third converted value inputted from the hold circuit 31C, with the set voltage $V_{ref}$ corresponding to the device protection sensing level, and outputs an unignited state detection signal, when the third converted value reaches or exceeds the set voltage $V_{ref}$.

FIG. 18B shows a general schematic configuration of the digital circuit constituting the integrating circuit. The integrating circuit is made up of coefficient units, an adder, and a delay device. The coefficient units are provided with coefficients of "a" and "1−a", respectively.

The coefficient "a" provided in the coefficient unit of the first integrating circuit 31A is expressed as:

$$a = \tau_1/(\tau_1+T),$$

and the coefficient "a" provided in the coefficient unit of the second integrating circuit 31B is expressed as:

$$a = \tau_2/(\tau_2+T)$$

Here, the time constants $\tau_1$ and $\tau_2$ are respectively expressed as;

$$\tau_1 = C \cdot R_p$$

$$\tau_2 = C \cdot R_2$$

and T indicates a period of pulse driving.

Second Configuration Example

FIG. 19 shows a configuration example where a counting circuit constitutes the unignited state detection device.

The conversion means 41 of the unignited state detection device 40 is provided with an addition circuit 41A, a subtraction circuit 41B, an adder 41C, and a switching circuit 41D, and a comparator 42 is also provided. The addition circuit 41A calculates a first converted value corresponding to an amount of heat that is applied to the RF power amplifier element of the RF power source, by adding a voltage value X that is obtained by sampling reflected wave voltage and performing A/D conversion. The subtraction circuit 41B counts a numerical value corresponding to the discharging time constant $\tau_{disc}$ during the $RF_{off}$ interval, calculates a second converted value corresponding to an amount of heat dissipated from the RF power amplifier element of the RF power source, further calculates a third converted value corresponding to a difference between the first converted value and the second converted value, and then outputs the result to the comparator 42.

The comparator 42 compares the third converted value inputted from the subtraction circuit 41B with the set voltage $V_{ref}$ corresponding to the device protection sensing level, and when the third converted value reaches or exceeds the set voltage $V_{ref}$, an unignited state detection signal is outputted.

At the time when the operations in one cycle are completed, an added and subtracted value obtained from the subtraction circuit 41B is returned to the adder 41C as an initial value, and a third converted value over plural periods is calculated in association with the high-frequency pulse mode.

The preferred embodiments and modifications described above are examples of the unignited plasma state detection method and the detection device relating to the present invention. The present invention is not limited to those exemplary embodiments and various modifications are possible on the basis of the spirit of the present invention, and all such modifications are intended to be included within the scope of the invention.

INDUSTRIAL APPLICABILITY

The unignited plasma state detection device and the detection method thereof according to the present invention can be applied to power supply to a plasma load. And it is applicable to a film forming apparatus to produce a thin film, such as a semiconductor, liquid crystal, and solar panel, and to plasma generation by high frequency wave (RF) in a $CO_2$ laser beam machine, or the like.

DESCRIPTION OF SYMBOLS 1 unignited state detection device
2 power sensor
3 power Controller
4 buffer
10 unignited state detection device
11 conversion means
11A conversion means
11B conversion means
11C conversion means
12 comparison means
20 unignited state detection device
20a Charging and discharging circuit
20b comparator
$20_{circuit}$ ignited state detection circuit
21 conversion means
21A Charging voltage calculation means
21B discharging voltage calculation means
21C charging and discharging voltage calculation means
22 voltage comparison means
30 unignited state detection device
31 conversion means
31A integrating circuit
31B integrating circuit
31C hold circuit
31D, 31E switching circuit
32 comparator
40 unignited state detection device
41 conversion means
41A addition circuit
41B subtraction circuit
41C adder
41D switching circuit
42 comparator
101 matching box
102 plasma load
a coefficient
C capacitor
D block diode
$E_m$ step voltage
$H_{ac}$ equivalent amount of heat storage
$i_1$ current
$i_2$ current
$i_c$ current
$k_1$ coefficient
$k_2$ coefficient
$R_1$ charging and discharging resistance
$R_2$ discharging resistance
T period
$t_1$ duration
$t_2$ allowable on-time
$t_3$ time width
$t_a$ on-time width
$V_a$ charging and discharging voltage
$V_f$ forward wave voltage
$V_{fail}$ unignited state detection signal
$V_{in}$ input voltage
$V_r$ reflected wave voltage
$V_{ref}$ set voltage
X voltage value Γ reflection coefficient
$\tau_1$ time constant
$\tau_c$ charging time constant
$\tau_{disc}$ discharging time constant

What is claimed is:

1. An unignited plasma state discrimination method in supplying a pulse output from a radio frequency power source to a plasma load by pulse driving, comprising,
   detecting reflected wave voltage traveling from the plasma load to the radio frequency power source,
   obtaining an equivalent amount corresponding to an amount of heat applied to an RF power amplifier element of the radio frequency power source, on the basis of a peak value and a fluctuation state of the reflected wave voltage,
   comparing the equivalent amount being obtained with a threshold to discriminate an unignited state of plasma, of plasma, an allowable heat quantity of the RF power amplifier element is set as the threshold, and
   discriminating an unignited state of plasma on the basis of a result of the comparison.

2. The unignited plasma state discrimination method according to claim 1, comprising,
   a first conversion step of obtaining a first converted value corresponding to the amount of heat applied to the RF power amplifier element of the radio frequency power source, on the basis of the reflected wave voltage and a duration of time thereof,
   a second conversion step of obtaining a second converted value corresponding to an amount of heat dissipated from the RF power amplifier element of the radio frequency power source, on the basis of an elapsed time from when a peak value of the reflected wave voltage $V_r$ becomes zero, or an elapsed time from when application of the pulse output is started, in every cycle of the pulse driving,
   a third conversion step of obtaining a third converted value corresponding to an amount of heat storage in the RF power amplifier element of the radio frequency power source, from a difference between the first converted value and the second converted value, and
   a comparison step of comparing the third converted value with the threshold corresponding to the allowable heat quantity of the RF power amplifier element, wherein,
   in the comparison step, the unignited state of plasma is discriminated when the third converted value reaches or exceeds the threshold.

3. The unignited plasma state discrimination method according to claim 2, wherein,
   a discharging time constant ($\tau_{disc}$) is selected in such a manner as being longer than a charging time constant ($\tau_c$), not allowing charging and discharging voltage to reach a voltage level of a device protection sensing level, under the condition that a pulse frequency of the pulse driving in a normal time is a maximum settable value and a duty ratio of $RF_{on}$ interval in one cycle of the pulse driving is a maximum settable value,
   in the first conversion step, charging voltage obtained by charging the peak value of the reflected wave voltage at the charging time constant ($\tau_c$) is considered as the first converted value,
   in the second and third conversion steps, voltage obtained by discharging from the charging voltage at the discharging time constant ($\tau_{disc}$) in a time width when the peak value of the reflected wave is zero, is considered as the third converted value, and
   in the comparison step, the charging voltage corresponding to the allowable heat quantity of the RF power amplifier element is considered as the threshold.

4. The unignited plasma state discrimination method according to claim 2, wherein,
   when a time width of interval for outputting pulses is $RF_{on}$, and a time width of interval not outputting pulses is $RF_{off}$,
   the first converted value is calculated according to $(V_r \times k_1 \times \int_0^{RF_{on}} tdt)$ indicating time integration of a product $(V_r \times k_1)$ of the peak value $V_r$ of the reflected wave voltage, and a coefficient $k_1$ corresponding to a heat generation coefficient of the RF power amplifier element,
   the second converted value is calculated according to $(k_2 \times \int_0^{RF_{off}} tdt)$ indicating the time integration of the coefficient $k_2$ to the heat dissipation coefficient of the RF power amplifier element,
   the third converted value is calculated by an operation for subtracting the second converted value from the first converted value $\{(V_r \times k_1 \times \int_0^{RF_{on}} tdt) - (k_2 \times \int_0^{RF_{off}} tdt)\}$ where zero is the lowermost value, and
   the first converted value, the second converted value, and the third converted value are calculated in every cycle of plasma driving, and the third converted value obtained in a previous period is used as an initial value of the first converted value in a subsequent period.

5. An unignited plasma state discrimination device for discrimination an unignited state of plasma of a plasma load, in supplying a pulse output from a radio frequency power source to the plasma load by pulse driving, comprising,
   a detection means configured to detect reflected wave voltage traveling from the plasma load to the radio frequency power source,
   a conversion means configured to obtain an equivalent amount corresponding to an amount of heat applied to an RF power amplifier element of the radio frequency power source, on the basis of a peak value and a fluctuation state of the reflected wave voltage, and
   a comparison means configured to compare the equivalent amount obtained in the conversion means with a threshold to discriminate an unignited state of plasma, of plasma, an allowable heat quantity of the RF power amplifier element is set as the threshold, wherein,
   the unignited state of plasma is discriminated on the basis of a result of the comparison means.

6. The unignited plasma state discrimination device according to claim 5, wherein,
   the conversion means comprises,
   a first conversion means configured to obtain a first converted value corresponding to the amount of heat applied to the RF power amplifier element of the radio frequency power source, on the basis of the reflected wave voltage and a duration of time thereof,
   a second conversion means configured to obtain a second converted value corresponding to an amount of heat dissipated from the RF power amplifier element of the radio frequency power source, on the basis of an elapsed time from when a peak value of the reflected wave voltage $V_r$ becomes zero, or an elapsed time from when application of the pulse output is started, in every cycle of the pulse driving, and
   a third conversion means configured to obtain a third converted value corresponding to an amount of heat stored in the RF power amplifier element of the radio frequency power source, from a difference between the first converted value and the second converted value, wherein, the comparison means compares the third converted value obtained in the third conversion means, with the threshold corresponding to the allowable heat quantity of the RF power amplifier element, and discriminates the unignited state of plasma when the third converted value reaches or exceeds the threshold.

7. The unignited plasma state discrimination device according to claim 6, further comprising, a charging and discharging circuit configured to charge the reflected wave voltage and to discharge voltage being charged, and a comparator configured to input an output from the charging and discharging circuit, wherein, a discharging time constant ($\tau_{disc}$) is selected in such a manner as being longer than a charging time constant ($\tau_c$), not allowing the charging and discharging voltage to reach a voltage level of the device protection sensing level in charging and discharging, under the condition that a pulse frequency of the pulse driving in a normal time is a maximum settable value and a duty ratio of $RF_{on}$ interval in one cycle of the pulse driving is a maximum settable value, the first conversion means is configured by a charging part of the charging and discharging circuit, and the charging part outputs as the first converted value, charging voltage obtained by charging the reflected wave voltage detected by the detection means at the charging time constant ($\tau_c$), the second means and third conversion means are configured by a discharging part of the charging and discharging circuit, and the discharging part outputs as the third converted value, voltage obtained by discharging from the charging voltage at the discharging time constant ($\tau_{disc}$) in a time width when the peak value of the reflected wave is zero, and the comparison means is configured by the comparator that uses the charging voltage corresponding to the allowable heat quantity of the RF power amplifier element as the threshold, and compares the third converted value outputted from the charging and discharging circuit with the threshold.

8. The unignited plasma state discrimination device according to claim 6, further comprising, an A/D conversion circuit configured to convert the reflected wave voltage $V_r$ detected by the detection means into a digital value, an operation circuit configured to perform a digital operation using the digital value as an input value, wherein, in the operation circuit, when a time width of interval for outputting pulses is $RF_{on}$, and a time width of interval not outputting pulses is $RF_{off}$, the first conversion means comprises a first operation part configured to calculate the first converted value according to an operation of $(V_r \times k_1 \times \int_0^{RF_{on}} t dt)$ indicating time integration of a product $(V_r \times k_1)$ of the peak value $V_r$ of the reflected wave voltage and a coefficient $k_1$ corresponding to a heat generation coefficient of the RF power amplifier element, the second conversion means comprises a second operation part configured to calculate the second converted value according to the operation of $(k_2 \times \int_0^{RF_{off}} t dt)$ indicating the time integration of the coefficient $k_2$ corresponding to the heat dissipation coefficient of the RF power amplifier element, and the third conversion means comprises a third operation part configured to calculate the third converted value by the operation for subtracting the second converted value from the first converted value a $\{(V_r \times k_1 \times \int_0^{RF_{on}} t dt) - (k_2 \times \int_0^{RF_{off}} t dt)\}$ where the lowermost value is zero, wherein, the first converted value, the second converted value, and the third converted value are calculated in every cycle of the plasma driving, and the third converted value obtained in a previous period is used as an initial value of the first converted value in a subsequent period.

* * * * *